(12) United States Patent
Liu et al.

(10) Patent No.: US 9,017,933 B2
(45) Date of Patent: *Apr. 28, 2015

(54) METHOD FOR INTEGRATING LOW-K DIELECTRICS

(75) Inventors: Junjun Liu, Austin, TX (US); Dorel I. Toma, Dripping Springs, TX (US); Hongyu Yue, Plano, TX (US)

(73) Assignee: Tokyo Electron Limited, Tokyo (JP)

( * ) Notice: Subject to any disclaimer, the term of this patent is extended or adjusted under 35 U.S.C. 154(b) by 76 days.

This patent is subject to a terminal disclaimer.

(21) Appl. No.: 13/072,662

(22) Filed: Mar. 25, 2011

(65) Prior Publication Data

US 2011/0237080 A1 Sep. 29, 2011

Related U.S. Application Data

(60) Provisional application No. 61/318,719, filed on Mar. 29, 2010.

(51) Int. Cl.
| | | |
|---|---|---|
| *G03F 7/40* | (2006.01) | |
| *H01L 21/67* | (2006.01) | |
| *B08B 7/00* | (2006.01) | |

(52) U.S. Cl.
CPC ........ *H01L 21/67028* (2013.01); *B08B 7/0042* (2013.01); *B08B 7/005* (2013.01); *B08B 7/0057* (2013.01); *H01L 21/67115* (2013.01); *Y10S 430/145* (2013.01)

(58) Field of Classification Search
USPC ........................................ 430/328, 330, 944
See application file for complete search history.

(56) References Cited

U.S. PATENT DOCUMENTS

| | | | |
|---|---|---|---|
| 5,705,232 A | 1/1998 | Hwang et al. | |
| 5,710,407 A | 1/1998 | Moore | |
| 6,136,729 A | 10/2000 | Hopper et al. | |
| 6,232,248 B1 | 5/2001 | Shinriki | |
| 6,303,524 B1 | 10/2001 | Sharangpani | |
| 6,444,037 B1 | 9/2002 | Frankel | |
| 6,509,259 B1 | 1/2003 | Wang et al. | |
| 6,596,467 B2 | 7/2003 | Gallagher | |
| 6,689,218 B2 | 2/2004 | Potyralio et al. | |
| 6,692,903 B2 | 2/2004 | Chen et al. | |
| 6,756,085 B2 | 6/2004 | Waldfried et al. | |
| 6,764,718 B2 | 7/2004 | Nakamura et al. | |
| 6,786,974 B2 | 9/2004 | Komiya et al. | |
| 6,818,864 B2 | 11/2004 | Ptak | |
| 6,846,748 B2 * | 1/2005 | Chien et al. ................... | 438/709 |
| 6,962,871 B2 | 11/2005 | Lee et al. | |
| 7,000,621 B1 | 2/2006 | Verhaverbeke | |
| 7,030,468 B2 | 4/2006 | Gates et al. | |
| 7,081,638 B1 | 7/2006 | Augur | |
| 7,090,966 B2 | 8/2006 | Hirai et al. | |
| 7,098,149 B2 | 8/2006 | Lukas et al. | |
| 7,166,531 B1 | 1/2007 | van den Hoek et al. | |
| 7,166,963 B2 | 1/2007 | Janos et al. | |
| 7,223,670 B2 | 5/2007 | Callegari et al. | |
| 7,282,458 B2 | 10/2007 | Gates et al. | |
| 7,291,550 B2 * | 11/2007 | Kim ............................. | 438/618 |
| 7,404,990 B2 | 7/2008 | Lukas et al. | |
| 7,405,168 B2 | 7/2008 | Lee | |
| 7,622,378 B2 | 11/2009 | Liu et al. | |
| 7,858,533 B2 | 12/2010 | Liu et al. | |
| 8,242,460 B2 * | 8/2012 | Yue et al. .................. | 250/455.11 |
| 2002/0092472 A1 | 7/2002 | Hayashi et al. | |
| 2002/0142579 A1 | 10/2002 | Vincent et al. | |
| 2003/0054115 A1 | 3/2003 | Albano et al. | |
| 2003/0070690 A1 | 4/2003 | Danese | |
| 2003/0224544 A1 | 12/2003 | Prisco et al. | |
| 2004/0018319 A1 | 1/2004 | Waldfried et al. | |
| 2004/0096593 A1 | 5/2004 | Lukas et al. | |
| 2004/0096672 A1 | 5/2004 | Lukas et al. | |
| 2004/0166628 A1 | 8/2004 | Park et al. | |
| 2004/0175501 A1 | 9/2004 | Lukas et al. | |
| 2004/0175957 A1 | 9/2004 | Lukas et al. | |
| 2004/0253839 A1 | 12/2004 | Shimizu et al. | |
| 2005/0064726 A1 | 3/2005 | Reid et al. | |
| 2005/0085094 A1 | 4/2005 | Yoo | |
| 2005/0272220 A1 | 12/2005 | Waldfried | |
| 2006/0018639 A1 | 1/2006 | Ramamurthy et al. | |
| 2006/0024976 A1 | 2/2006 | Waldfried et al. | |
| 2006/0141806 A1 | 6/2006 | Waldfried et al. | |
| 2006/0165904 A1 | 7/2006 | Ohara | |
| 2006/0183345 A1 | 8/2006 | Nguyen et al. | |
| 2006/0202311 A1 | 9/2006 | Nguyen et al. | |
| 2006/0249078 A1 | 11/2006 | Nowak et al. | |

(Continued)

OTHER PUBLICATIONS

Volksen et al., A Novel Post-Porosity Treatment for Significant Toughening of Low-k Organosilicates, IEEE, 2006, pp. 146-148.

(Continued)

*Primary Examiner* — Daborah Chacko Davis
(74) *Attorney, Agent, or Firm* — Oblon, McClelland, Maier & Neustadt, L.L.P.

(57) ABSTRACT

A method for treating a dielectric film on a substrate and, in particular, a method for integrating a low-k dielectric film with subsequently formed metal interconnects is described. The method includes preparing a dielectric film on a substrate, wherein the dielectric film is a low-k dielectric film having a dielectric constant less than or equal to a value of about 4. Thereafter, the method further includes performing a preliminary curing process on the dielectric film, forming a pattern in the dielectric film using a lithographic process and an etching process, removing undesired residues from the substrate, and performing a final curing process on the dielectric film, wherein the final curing process includes irradiating the substrate with ultraviolet (UV) radiation.

21 Claims, 16 Drawing Sheets

(56) References Cited

U.S. PATENT DOCUMENTS

| | | |
|---|---|---|
| 2006/0251827 A1 | 11/2006 | Nowak et al. |
| 2006/0274405 A1 | 12/2006 | Waldfried et al. |
| 2007/0105401 A1 | 5/2007 | Liu et al. |
| 2007/0109003 A1 | 5/2007 | Shi et al. |
| 2007/0161230 A1 | 7/2007 | Chen et al. |
| 2007/0228289 A1 | 10/2007 | Kaszuba et al. |
| 2007/0228618 A1 | 10/2007 | Kaszuba et al. |
| 2007/0257205 A1 | 11/2007 | Rocha-Alvarez et al. |
| 2007/0264786 A1 | 11/2007 | Chen et al. |
| 2007/0284698 A1 | 12/2007 | Callegari et al. |
| 2007/0286963 A1 | 12/2007 | Rocha-Alvarez et al. |
| 2008/0063809 A1 | 3/2008 | Lee et al. |
| 2008/0067425 A1 | 3/2008 | Kaszuba et al. |
| 2009/0075491 A1 | 3/2009 | Liu et al. |
| 2009/0226694 A1 | 9/2009 | Liu et al. |
| 2009/0226695 A1 | 9/2009 | Liu et al. |
| 2009/0227118 A1 | 9/2009 | Liu et al. |
| 2009/0227119 A1 | 9/2009 | Liu et al. |
| 2010/0041248 A1 | 2/2010 | Liu et al. |
| 2010/0055807 A1* | 3/2010 | Srivastava et al. ............... 438/9 |
| 2010/0065758 A1 | 3/2010 | Liu et al. |
| 2010/0065759 A1 | 3/2010 | Liu et al. |
| 2010/0067886 A1 | 3/2010 | Liu et al. |
| 2010/0068897 A1 | 3/2010 | Liu et al. |

OTHER PUBLICATIONS

Abell et al., Solid State MAS NMR Spectroscopic Characterization of Plasma Damage and UV Modification of Low K Dielectric Films, Mater. Res. Soc. Symp. Proc., vol. 863, Materials Research Society, 2005, pp. B1.8.1-B1.8.6.

International Searching Authority, International Search Report and Written Opinion, International Application No. PCT/US11/30133, Mailed Jul. 15, 2011, 13 pages.

* cited by examiner

METHOD FOR INTEGRATING LOW-K DIELECTRICS

CROSS-REFERENCE TO RELATED APPLICATIONS

Pursuant to 37 CFR §1.78(a)(4), this application claims the benefit of and priority to U.S. Provisional application Ser. No. 61/318,719 filed on Mar. 29, 2010; the entire content of which is herein incorporated by reference.

BACKGROUND OF THE INVENTION

1. Field of the Invention

The invention relates to a method for preparing a low dielectric constant (low-k) dielectric film, patterning the low-k dielectric film, and integrating the low-k dielectric film with subsequently formed metal interconnects.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials as the insulating dielectric for metal wires in the IC devices. Thus, in recent years, low-k materials have been developed to replace relatively high dielectric constant insulating materials, such as silicon dioxide. In particular, low-k films are being utilized for inter-level and intra-level dielectric layers between metal wires in semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

Low-k materials are less robust than more traditional silicon dioxide, and the mechanical strength deteriorates further with the introduction of porosity. The porous low-k films can easily be damaged during plasma processing, thereby making desirable a mechanical strengthening process. It has been understood that enhancement of the material strength of porous low-k dielectrics is essential for their successful integration. Aimed at mechanical strengthening, alternative curing techniques are being explored to make porous low-k films more robust and suitable for integration.

The curing of a polymer includes a process whereby a thin film deposited, for example, using spin-on or vapor deposition (such as chemical vapor deposition CVD) techniques, is treated in order to cause cross-linking within the film. During the curing process, free radical polymerization is understood to be the primary route for cross-linking. As polymer chains cross-link, mechanical properties, such as for example the Young's modulus, the film hardness, the fracture toughness and the interfacial adhesion, are improved, thereby improving the fabrication robustness of the low-k film.

As there are various strategies to forming porous dielectric films with ultra low dielectric constant, the objectives of post-deposition treatments (curing) may vary from film to film, including for example the removal of moisture, the removal of solvents, the burn-out of porogens used to form the pores in the porous dielectric film, the improvement of the mechanical properties for such films, and so on.

Low dielectric constant (low k) materials are conventionally thermally cured at a temperature in the range of 300° C. to 400° C. for CVD films. In some instances, furnace curing has been sufficient in producing strong, dense low-k films with a dielectric constant greater than approximately 2.5. However, when processing porous dielectric films (such as ultra low-k films) with a high level of porosity, the degree of cross-linking achievable with thermal treatment (or thermal curing) is no longer sufficient to produce films of adequate strength for a robust interconnect structure.

During thermal curing, an appropriate amount of energy is delivered to the dielectric film without damaging the dielectric film. Within the temperature range of interest, however, only a small amount of free radicals can be generated. Only a small amount of thermal energy can actually be absorbed in the low-k films to be cured due to the thermal energy lost in the coupling of heat to the substrate and the heat loss in the ambient environment. Therefore, high temperatures and long curing times are required for typical low-k furnace curing. But even with a high thermal budget, the lack of initiator generation in the thermal curing and the presence of a large amount of methyl termination in the as-deposited low-k film can make it very difficult to achieve the desired degree of cross-linking.

SUMMARY OF THE INVENTION

The invention relates to a method for treating a dielectric film on a substrate and, in particular, a method for integrating a low-k dielectric film with subsequently formed metal interconnects.

According to an embodiment, a method of integrating a dielectric film on a substrate is described. The method includes preparing a dielectric film on a substrate, wherein the dielectric film is a low-k dielectric film having a dielectric constant less than or equal to a value of 4. The method further includes performing a preliminary curing process on the dielectric film, forming a pattern in the dielectric film using a lithographic process and an etching process, removing undesired residues from the substrate, and performing a final curing process on the dielectric film, wherein the final curing process includes irradiating the substrate with ultraviolet (UV) radiation.

DETAILED DESCRIPTION OF EXEMPLARY EMBODIMENTS

Figure 1:
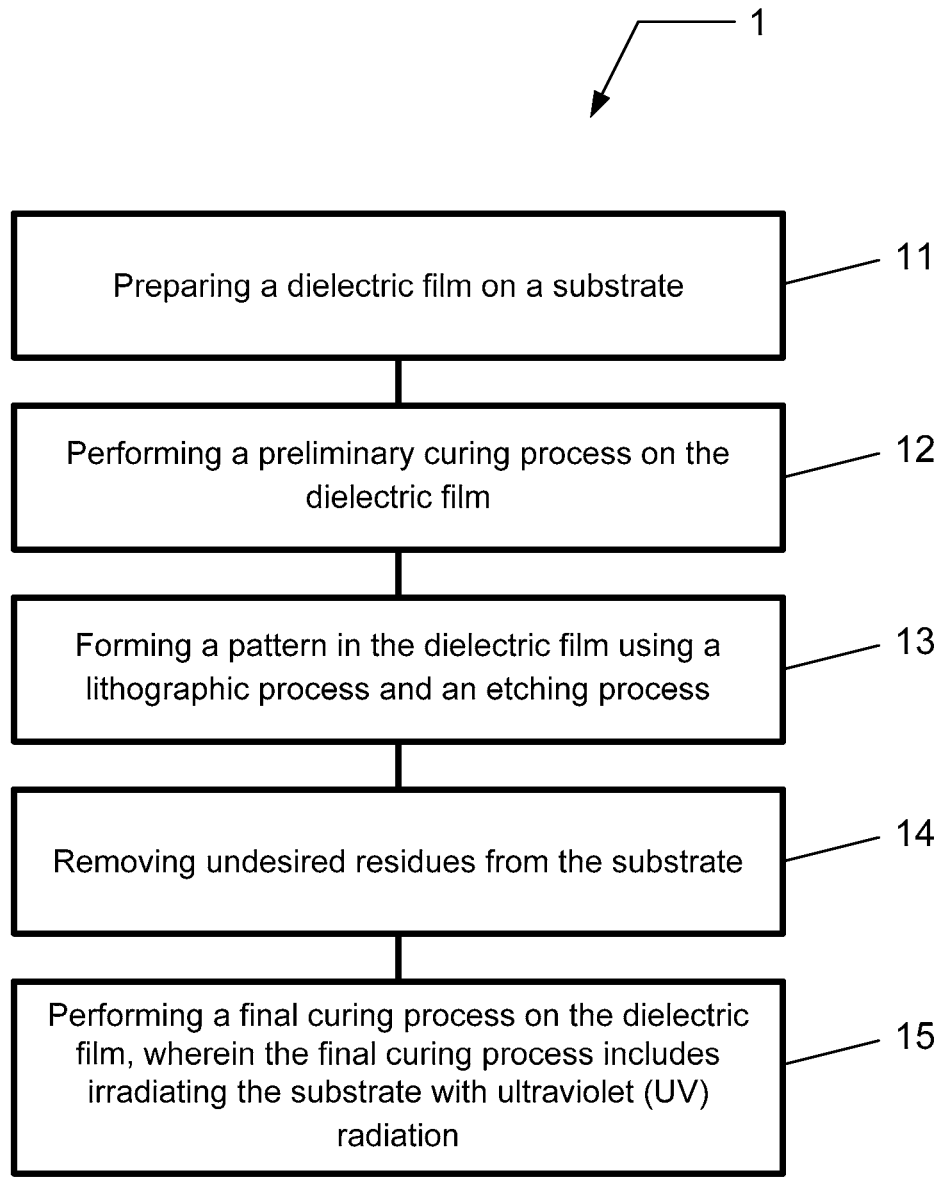
FIG. 1 illustrates a method of integrating a dielectric film on a substrate according to an embodiment.

Methods for integrating, patterning, treating, curing, and cleaning dielectric layers, including low-k dielectric films, on a substrate using electromagnetic (EM) radiation are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The inventors recognized that alternative methods for treating a substrate, and in particular, treating a substrate having a low-k dielectric film, address some of the deficiencies of conventional curing methods, such as thermal curing, as well as conventional cleaning methods, such as plasma ashing and wet cleaning. For instance, alternative methods for curing and cleaning such films are more efficient in energy transfer, as compared to their conventional counterpart, and the higher energy levels found in the form of energetic particles, such as accelerated electrons, ions, or neutrals, or in the form of energetic photons, can easily excite electrons in a low-k dielectric film, thus efficiently breaking chemical bonds and dissociating side groups. These alternative methods may facilitate the generation of cross-linking initiators (free radicals) and can improve the energy transfer required in actual cross-linking. As a result, the degree of cross-linking can be increased at a reduced thermal budget.

Additionally, the inventors have realized that, when film strength becomes a greater issue for the integration of low-k and ultra-low-k (ULK) dielectric films (dielectric constant less than approximately 2.5), alternative methods for curing and cleaning such films may improve the mechanical properties of such films. For example, electron beam (EB), ultra-violet (UV) radiation, infrared (IR) radiation and microwave (MW) radiation may be used to cure low-k films and ULK films in order to improve mechanical strength, while not sacrificing the dielectric property and film hydrophobicity.

However, although EB, UV, IR and MW curing all have their own benefits, these techniques also have limitations. High energy curing sources such as EB and UV can provide high energy levels to generate more than enough cross-linking initiators (free radicals) for cross-linking, which leads to much improved mechanical properties under complementary substrate heating. On the other hand, electrons and UV photons can cause indiscriminate dissociation of chemical bonds, which may adversely degrade the desired physical and electrical properties of the film, such as loss of hydrophobicity, increased residual film stress, collapse of pore structure, film densification and increased dielectric constant. Furthermore, low energy curing sources, such as MW curing, can provide significant improvements mostly in the heat transfer efficiency, but in the meantime have side effects, such as for example arcing or transistor damage.

Figure 2:
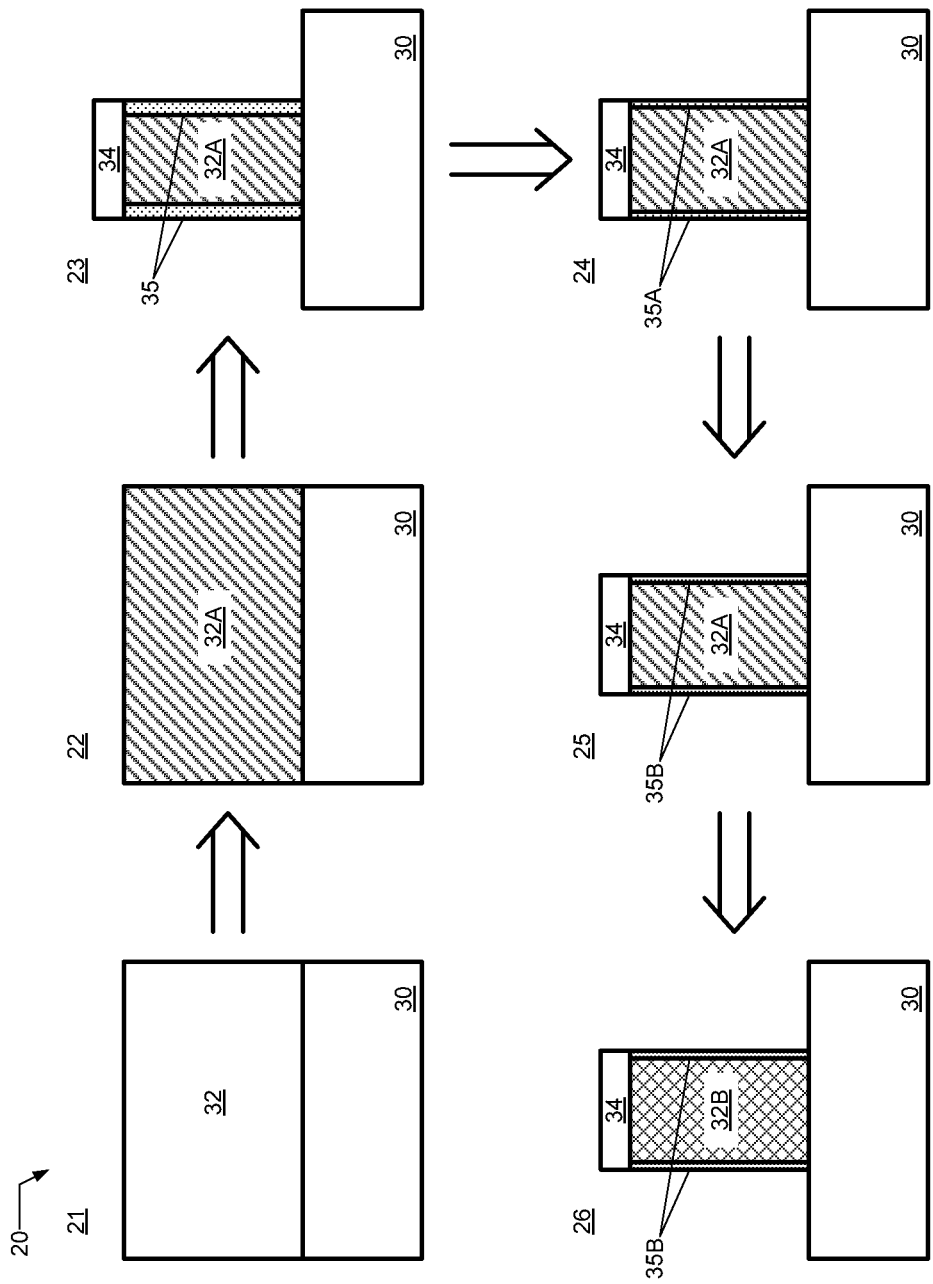
FIG. 2 illustrates a method of integrating a dielectric film on a substrate according to another embodiment.

Therefore, according to various embodiments, methods for integrating, patterning, treating, curing, and cleaning dielectric layers, including low-k dielectric films, on a substrate using EM radiation are disclosed. Referring now to the drawings wherein like reference numerals designate corresponding parts throughout the several views, FIG. 1 provides a flow chart 1 illustrating a method for integrating a dielectric film on a substrate according to an embodiment. Furthermore, a pictorial view 20 of a method of integrating a dielectric film on a substrate is illustrated in FIG. 2.

The method illustrated in flow chart 1 begins in step 11 (pictorial view 21) with preparing a dielectric film 32 on a substrate 30, wherein the dielectric film 32 is a low-k dielectric film having a dielectric constant less than or equal to a value of 4. Substrate 30 may be a semiconductor, a metallic conductor, or any other substrate to which the dielectric film 32 is to be formed upon. Dielectric film 32 may have a dielectric constant value (before drying and/or curing, or after drying and/or curing, or both) less than the dielectric constant of $SiO_2$, which is about 4 (e.g., the dielectric constant for thermal silicon dioxide can range from about 3.8 to 3.9). In various embodiments of the invention, the dielectric film 32 may have a dielectric constant (before drying and/or curing, or after drying and/or curing, or both) of less than about 3.0, a dielectric constant of less than about 2.5, a dielectric constant of less than about 2.2, or a dielectric constant of less than about 1.7.

The dielectric film 32 may be described as a low dielectric constant (low-k) film or an ultra-low-k film. The dielectric film 32 may include at least one of an organic, inorganic, and inorganic-organic hybrid material. Additionally, the dielectric film 32 may be porous or non-porous.

The dielectric film 32 may, for instance, include a single phase or dual phase porous low-k film that includes a structure-forming material and a pore-generating material. The structure-forming material may include an atom, a molecule, or fragment of a molecule that is derived from a structure-forming precursor. The pore-generating material may include an atom, a molecule, or fragment of a molecule that is derived from a pore-generating precursor (e.g., porogen). The single phase or dual phase porous low-k film may have a higher dielectric constant prior to removal of the pore-generating material than following the removal of the pore-generating material.

The forming of a single phase porous low-k film may include depositing a structure-forming molecule having a pore-generating molecular side group weakly bonded to the structure-forming molecule on a surface of a substrate. For example, a single-phase material may include a silicon oxide-based matrix having terminal organic side groups that inhibit cross-linking during a curing process to create small voids (or pores). Additionally, the forming of a dual phase porous low-k film may include co-polymerizing a structure-forming molecule and a pore-generating molecule on a surface of a substrate. For example, a dual-phase material may include a silicon oxide-based matrix having inclusions of organic material (e.g., a porogen) that is decomposed and evaporated during a curing process.

Additionally, the dielectric film 32 may have moisture, water, solvent, and/or other contaminants which cause the dielectric constant to be higher prior to drying and/or curing than following drying and/or curing.

The dielectric film 32 may be formed using chemical vapor deposition (CVD) techniques, or spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a film on a substrate as known to those skilled in the art of both spin-on dielectric technology and CVD dielectric technology are suitable for the invention.

In 12 and in pictorial view 22, a preliminary curing process is performed on dielectric film 32 to at least partially cure dielectric film 32 to produce soft-cured dielectric film 32A. The preliminary curing process may precede any patterning of the dielectric film 32, and may include a thermal curing process, an infrared (IR) curing process, or an ultraviolet (UV) curing process, or any combination of two or more thereof. Additionally, the preliminary curing process may be performed at a first substrate temperature. As an example, the preliminary curing process may cause preliminary cross-linking to assist in relieving stress in the dielectric film 32 during subsequent curing step(s). Furthermore, for example, the preliminary curing process may cause reduction in damage incurred during subsequent patterning via etch processes and/or cleaning processes.

In one embodiment, the preliminary curing process includes soft-curing the dielectric film 32 using UV radiation with optional IR radiation and optional thermal heating.

During the preliminary curing process, the UV exposure may comprise a plurality of UV exposures, wherein each UV exposure may or may not include a different intensity, power, power density, exposure times, or wavelength range, or any combination of two or more thereof. Additionally, the IR exposure may comprise a plurality of IR exposures, wherein each IR exposure may or may not include a different intensity, power, power density, exposure times, or wavelength range, or any combination of two or more thereof. Furthermore, the UV exposure and the IR exposure may be performed either sequentially or in parallel.

During the UV exposure, or the IR exposure, or both, dielectric film 32 may be heated by elevating the substrate temperature of substrate 30 to the first substrate temperature, wherein the first substrate temperature ranges from about 100 degrees C. (Celsius, or Centigrade) to about 600 degrees C. Alternatively, the first substrate temperature ranges from about 100 degrees C. to about 500 degrees C. Alternatively, the first substrate temperature ranges from about 100 degrees C. to about 300 degrees C. Substrate thermal heating may be performed by conductive heating, convective heating, or radiative heating, or any combination of two or more thereof. For example, the substrate temperature may be increased by elevating the temperature of a substrate holder in contact with substrate 30.

Additionally, thermal heating of substrate 30 may take place before UV exposure, during UV exposure, or after UV exposure, or any combination of two or more thereof. Additionally yet, thermal heating may take place before IR exposure, during IR exposure, or after IR exposure, or any combination of two or more thereof. Thermal heating may be performed by conductive heating, convective heating, or radiative heating, or any combination of two or more thereof.

Prior to UV and/or IR exposure, a drying process may be performed to remove, or partially remove, one or more contaminants in the dielectric film 32, including, for example, moisture, water, solvent, pore-generating material, residual pore-generating material, pore-generating molecules, fragments of pore-generating molecules, or any other contaminant that may interfere with the preliminary curing process.

The exposure of the dielectric film 32 to UV radiation may include exposing the dielectric film 32 to UV radiation from one or more UV lamps, one or more UV LEDs (light-emitting diodes), or one or more UV lasers, or a combination of two or more thereof. The UV radiation may be continuous or pulsed. The UV radiation may be broad band or narrow band. The UV radiation may include UV emission ranging in wavelength from approximately 100 nanometers (nm) to approximately 600 nm. Alternatively, the UV radiation may range in wavelength from approximately 150 nm to approximately 400 nm. Alternatively, the UV radiation may range in wavelength from approximately 200 nm to approximately 350 nm. Alternatively, the UV radiation may range in wavelength from approximately 150 nm to approximately 250 nm. Alternatively, the UV radiation may range in wavelength from approximately 170 nm to approximately 240 nm. Alternatively, the UV radiation may range in wavelength from approximately 200 nm to approximately 250 nm.

The exposure of the dielectric film 32 to IR radiation may include exposing the dielectric film 32 to IR radiation from one or more IR lamps, one or more IR LEDs (light emitting diodes), or one or more IR lasers, or a combination of two or more thereof. The IR radiation may be continuous or pulsed. The IR radiation may be broad band or narrow band. For example, the IR radiation may contain substantially monochromatic electromagnetic (EM) radiation having a narrow band of wavelengths. The IR radiation may include IR emission ranging in wavelength from approximately 1 micron to approximately 25 microns. Alternatively, the IR radiation may range in wavelength from approximately 2 microns to approximately 20 microns. Alternatively, the IR radiation may range in wavelength from approximately 8 microns to approximately 14 microns. Alternatively, the IR radiation may range in wavelength from approximately 8 microns to approximately 12 microns. Alternatively, the IR radiation may range in wavelength from approximately 9 microns to approximately 10 microns.

The inventors have recognized that the energy level (hv) delivered can be varied during different stages of the preliminary curing process. The preliminary curing process may include mechanisms for the removal of moisture and/or contaminants, the removal of pore-generating material, the decomposition of pore-generating material, the generation of cross-linking initiators, the cross-linking of the dielectric film, and the diffusion of the cross-linking initiators. Each mechanism may require a different energy level and rate at which energy is delivered to the dielectric film.

For instance, during the removal of pore-generating material, the removal process may be facilitated by photon absorption at IR wavelengths. The inventors have discovered that IR exposure assists the removal of pore-generating material more efficiently than thermal heating or UV exposure.

Additionally, for instance, during the removal of pore-generating material, the removal process may be assisted by decomposition of the pore-generating material. The removal process may include IR exposure that is complemented by UV exposure. The inventors have discovered that UV exposure may assist a removal process having IR exposure by dissociating bonds between pore-generating material (e.g., pore-generating molecules and/or pore-generating molecular fragments) and the structure-forming material. For example, the removal and/or decomposition processes may be assisted by photon absorption at UV wavelengths (e.g., about 300 nm to about 450 nm).

Furthermore, for instance, during the generation of cross-linking initiators, the initiator generation process may be facilitated by using photon and phonon induced bond dissociation within the structure-forming material. The inventors have discovered that the initiator generation process may be facilitated by UV exposure. For example, bond dissociation can require energy levels having a wavelength less than or equal to approximately 300 to 400 nm.

Further yet, for instance, during cross-linking, the cross-linking process can be facilitated by thermal energy sufficient for bond formation and reorganization. The inventors have discovered that cross-linking may be facilitated by IR exposure or thermal heating or both. For example, bond formation and reorganization may require energy levels having a wavelength of approximately 9 microns which, for example, corresponds to the main absorbance peak in siloxane-based organosilicate low-k materials.

In 13 and in pictorial view 23, a pattern is formed in the soft-cured dielectric film 32A using a lithographic process and an etching process. The lithographic process includes preparing the pattern in a layer of radiation-sensitive material, such as photo-resist, using an image exposure and developing sequence. For example, the pattern may include a trench or line pattern, or a via or hole pattern, or a combination thereof. The pattern is transferred to an underlying hard mask layer or cap layer 34 and, thereafter, to the soft-cured dielectric film 32A using one or more etch processes. The one or more etch processes may include dry and/or wet etch processes. For example, the one or more etch processes may include dry plasma and/or dry non-plasma etch processes.

In 14 and in pictorial view 24, undesired residues, such as surface residue 35, is removed from the substrate 30 to produce reduced residue 35A on the exposed surface of soft-cured dielectric film 32A. The exposed surface having reduced residue 35A may also exhibit reduced damage. As an example, the undesired residues may include surface adsorbates, particulates, moisture, etch residue, undesired carbon-containing residue, amorphous carbon-containing residue, hydrocarbon-containing residue, fluorocarbon-containing residue, halogen-containing residue, or polymer-containing residue, or any combination of two or more thereof.

During the patterning of dielectric film 32, or soft-cured dielectric film 32A, including ultra low-k dielectric films (i.e., dielectric films having a dielectric constant k less than or equal to a value of 2.5), the one or more etch processes utilized to perform the patterning of dielectric film 32 may cause damage to the dielectric film 32, or soft-cured dielectric film 32A, including degradation of the dielectric constant k, the surface roughness, and the hydrophilicity of the dielectric film 32, among others. Furthermore, during removal of the one or more mask layers utilized in the patterning of dielectric film 32, or soft-cured dielectric film 32A, using an ashing process, such as a plasma ashing process, and/or a wet cleaning process, additional degradation and/or damage, including additional accumulation of surface adsorbates, may be incurred. Further yet, during the preparation of a low dielectric constant k for dielectric film 30, or soft-cured dielectric film 32A, increased carbon content is desirable. However, when the carbon content is increased using a plasma enhanced chemical vapor deposition (PECVD) process, unintended amorphous carbon residue with a relatively high dielectric constant k remains which is difficult to remove. This amorphous carbon-containing residue prevents further reduction of the dielectric constant k.

Therefore, the removal of undesired residues may include: (1) stripping one or more mask layers, such as photo-resist or photo-resist residue, utilized during the patterning of dielectric film 32, or soft-cured dielectric film 32A; (2) cleaning one or more exposed surfaces of dielectric film 32, or soft-cured dielectric film 32A, to remove any of the aforementioned undesired residues or surface adsorbates, including moisture, etch residue, halogen-containing residue, fluorocarbon-containing residue, hydrocarbon-containing residue, etc.; (3) dehydrating one or more exposed surfaces of dielectric film 32, or soft-cured dielectric film 32A; (4) reducing the dielectric constant k of dielectric film 32, or soft-cured dielectric film 32A, with the removal of unintended amorphous carbon-containing residue; or (5) performing one or more stripping and/or cleaning processes without degrading and/or further damaging dielectric film 32, or soft-cured dielectric film 32A, or (6) performing any combination of two or more thereof.

In one embodiment, the undesired residues may be removed using a dry EM radiation cleaning process by irradiating substrate 30 containing the pattern in the dielectric film 32, or soft-cured dielectric film 32A, with IR radiation and optionally UV radiation. As will be discussed in greater detail below, undesired residues may be removed from substrate 30 by irradiating substrate 30 with a beam of IR radiation coupled with an optional exposure to UV radiation and/or an optional exposure to a gas or vapor jet emanating from a nozzle along a jet axis in a direction towards substrate 30, wherein the gas or vapor jet may be reactive or non-reactive with substrate 30. Furthermore, the removal of undesired residues may include heating substrate 30 to a substrate temperature ranging from about 20 degrees C. to about 250 degrees C.

The inventors believe that IR radiation, such as far IR emission, may be absorbed strongly in the patterned dielectric films, and/or typical surface adsorbates, such as hydrocarbon-containing material and fluorocarbon-containing material. Additionally, it is believed that the thermophoretic force resulting from the temperature gradient ensuing from EM radiation may assist in the removal of surface adsorbates and particulates. Furthermore, it is believed that UV radiation may assist in the scission of chemical bonds typical in surface adsorbates, such as photo-resist, hydrocarbon-containing material, and fluorocarbon-containing material, thus, facilitating the desorption process.

In another embodiment, the undesired residues may be removed using a dry EM radiation cleaning process, as described above, coupled with a reduced ashing process, such as a reduced plasma ashing process. The reduced ashing process may be utilized to remove, at least in part, undesired residues. For example, the reduced ashing process may include a process condition, such as a plasma process condition, that causes reduced damage to the dielectric film 32, or soft-cured dielectric film 32A. The process condition may include a reduced ashing time, a reduced plasma power, a reduced chemistry (e.g., less aggressive chemistry, or less damaging chemistry), or any combination thereof.

In yet another embodiment, the undesired residues may be removed using an ashing process, or a wet cleaning process, or both. For example, the ashing process may include a dry plasma ashing process. Additionally, for example, the wet cleaning process may include immersing substrate 30 in a wet cleaning solution, such as an aqueous HF solution.

In pictorial view 25, an optional silylation process may be performed following the removing of undesired residues in 14 (pictorial view 24), and preceding a final curing process to produce silylated surface layer 35B. The silylation process includes the introduction of a silyl group to the dielectric film 32, or soft-cured dielectric film 32A, to serve as a protecting group for planarization, healing, and/or sealing of the exposed surface of the dielectric film 32, or soft-cured dielectric film 32A.

In one embodiment, the silylation process may include introducing a silane compound, a silazane compound, HMDS, or TMCS, or any combination of two or more thereof. The silylation may further include maintaining substrate 30 at a substrate temperature between about 200 degrees C. and about 400 degrees C. In another embodiment, the silylation process may further include irradiating substrate 30 with UV radiation.

In 15 and in pictorial view 26, a final curing process is performed on dielectric film 32, or soft-cured dielectric film 32A, to at least additionally cure dielectric film 32 to produce hard-cured dielectric film 32B. The final curing process may include a thermal curing process, an IR curing process, or a UV curing process, or any combination of two or more thereof. Additionally, the final curing process may be performed at a second substrate temperature. In one embodiment, the second substrate temperature exceeds the first substrate temperature. As an example, the final curing process may cause substantially complete cross-linking of the dielectric film 32, or soft-cured dielectric film 32A, to produce enhanced film properties including, for example, mechanical properties.

In one embodiment, the final curing process includes hard-curing the dielectric film 32 using UV radiation with optional IR radiation and optional thermal heating.

During the final curing process, the UV exposure may comprise a plurality of UV exposures, wherein each UV exposure may or may not include a different intensity, power, power density, exposure times, or wavelength range, or any combination of two or more thereof. Additionally, the IR exposure may comprise a plurality of IR exposures, wherein each IR exposure may or may not include a different intensity, power, power density, exposure times, or wavelength range, or any combination of two or more thereof. Furthermore, the UV exposure and the IR exposure may be performed either sequentially or in parallel.

During the UV exposure, or the IR exposure, or both, dielectric film 32, or soft-cured dielectric film 32A, may be heated by elevating the substrate temperature of substrate 30 to the first substrate temperature, wherein the first substrate temperature ranges from approximately 100 degrees C. to approximately 600 degrees C. Alternatively, the first substrate temperature ranges from approximately 100 degrees C. to approximately 500 degrees C. Alternatively, the first substrate temperature ranges from approximately 100 degrees C. to approximately 300 degrees C. Substrate thermal heating may be performed by conductive heating, convective heating, or radiative heating, or any combination of two or more thereof. For example, the substrate temperature may be increased by elevating the temperature of a substrate holder in contact with substrate 30.

Additionally, thermal heating of substrate 30 may take place before UV exposure, during UV exposure, or after UV exposure, or any combination of two or more thereof. Additionally yet, thermal heating may take place before IR exposure, during IR exposure, or after IR exposure, or any combination of two or more thereof. Thermal heating may be performed by conductive heating, convective heating, or radiative heating, or any combination of two or more thereof.

Prior to UV and/or IR exposure, a drying process may be performed to remove, or partially remove, one or more contaminants in the dielectric film 32, or the soft-cured dielectric film 32A, including, for example, moisture, water, solvent, pore-generating material, residual pore-generating material, pore-generating molecules, fragments of pore-generating molecules, or any other contaminant that may interfere with the final curing process.

The exposure of the dielectric film 32, or the soft-cured dielectric film 32A, to UV radiation may include exposing the dielectric film 32, or the soft-cured dielectric film 32A, to UV radiation from one or more UV lamps, one or more UV LEDs (light-emitting diodes), or one or more UV lasers, or a combination of two or more thereof. The UV radiation may be continuous or pulsed. The UV radiation may be broad band or narrow band. The UV radiation may include UV emission ranging in wavelength from approximately 100 nanometers (nm) to approximately 600 nm. Alternatively, the UV radiation may range in wavelength from approximately 150 nm to approximately 400 nm. Alternatively, the UV radiation may range in wavelength from approximately 200 nm to approximately 350 nm. Alternatively, the UV radiation may range in wavelength from approximately 150 nm to approximately 250 nm. Alternatively, the UV radiation may range in wavelength from approximately 170 nm to approximately 240 nm. Alternatively, the UV radiation may range in wavelength from approximately 200 nm to approximately 250 nm.

The exposure of the dielectric film 32, or the soft-cured dielectric film 32A, to IR radiation may include exposing the dielectric film 32, or the soft-cured dielectric film 32A, to IR radiation from one or more IR lamps, one or more IR LEDs (light emitting diodes), or one or more IR lasers, or a combination of two or more thereof. The IR radiation may be continuous or pulsed. The IR radiation may be broad band or narrow band. For example, the IR radiation may contain substantially monochromatic electromagnetic (EM) radiation having a narrow band of wavelengths. The IR radiation may include IR emission ranging in wavelength from approximately 1 micron to approximately 25 microns. Alternatively, the IR radiation may range in wavelength from approximately 2 microns to approximately 20 microns. Alternatively, the IR radiation may range in wavelength from approximately 8 microns to approximately 14 microns. Alternatively, the IR radiation may range in wavelength from approximately 8 microns to approximately 12 microns. Alternatively, the IR radiation may range in wavelength from approximately 9 microns to approximately 10 microns.

The inventors have recognized that the energy level (hv) delivered can be varied during different stages of the final curing process. The final curing process may include mechanisms for the removal of moisture and/or contaminants, the removal of pore-generating material, the decomposition of pore-generating material, the generation of cross-linking initiators, the cross-linking of the dielectric film, and the diffusion of the cross-linking initiators. Each mechanism may require a different energy level and rate at which energy is delivered to the dielectric film.

For instance, during the removal of pore-generating material, the removal process may be facilitated by photon absorption at IR wavelengths. The inventors have discovered that IR exposure assists the removal of pore-generating material more efficiently than thermal heating or UV exposure.

Additionally, for instance, during the removal of pore-generating material, the removal process may be assisted by decomposition of the pore-generating material. The removal process may include IR exposure that is complemented by UV exposure. The inventors have discovered that UV exposure may assist a removal process having IR exposure by dissociating bonds between pore-generating material (e.g., pore-generating molecules and/or pore-generating molecular fragments) and the structure-forming material. For example, the removal and/or decomposition processes may be assisted by photon absorption at UV wavelengths (e.g., about 300 nm to about 450 nm).

Furthermore, for instance, during the generation of cross-linking initiators, the initiator generation process may be facilitated by using photon and phonon induced bond dissociation within the structure-forming material. The inventors have discovered that the initiator generation process may be facilitated by UV exposure. For example, bond dissociation can require energy levels having a wavelength less than or equal to approximately 300 to 400 nm.

Further yet, for instance, during cross-linking, the cross-linking process can be facilitated by thermal energy sufficient for bond formation and reorganization. The inventors have discovered that cross-linking may be facilitated by IR exposure or thermal heating or both. For example, bond formation and reorganization may require energy levels having a wavelength of approximately 9 microns which, for example, corresponds to the main absorbance peak in siloxane-based organosilicate low-k materials.

Furthermore, the patterned, hard-cured dielectric film 32B may optionally be post-treated in a post-treatment system configured to modify the hard-cured dielectric film 32B. For example, post-treatment may include thermal heating the hard-cured dielectric film 32B. Alternatively, for example, post-treatment may include spin coating or vapor depositing another film on the hard-cured dielectric film 32B in order to promote adhesion for subsequent films or improve hydrophobicity. Alternatively, for example, adhesion promotion may be achieved in a post-treatment system by lightly bombarding the hard-cured dielectric film 32B with ions. Moreover, the post-treatment may comprise performing one or more of depositing another film on the hard-cured dielectric film 32B, cleaning the hard-cured dielectric film 32B, or exposing the hard-cured dielectric film 32B to plasma.

Figure 3:
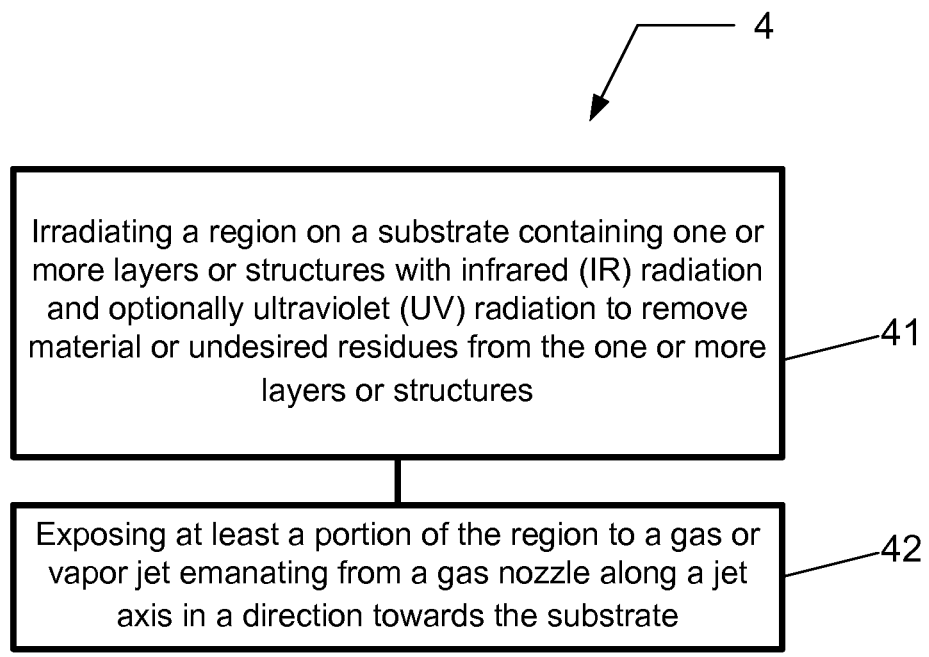
FIG. 3 illustrates a method of cleaning a substrate according to an embodiment.
Figure 4A:
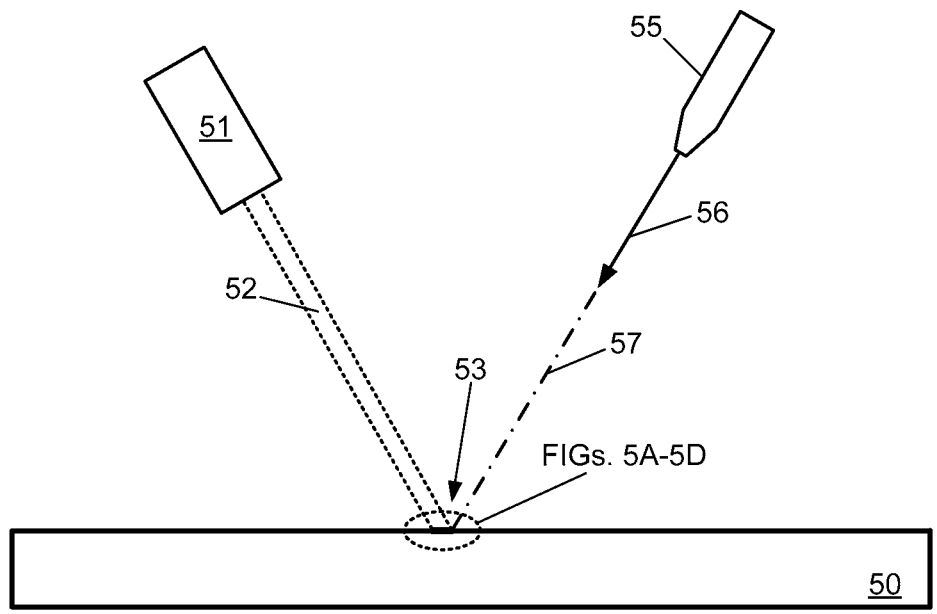
FIGS. 4A and 4B provide a schematic illustration of a method and system for cleaning a substrate according to additional embodiments.
Figure 4B:
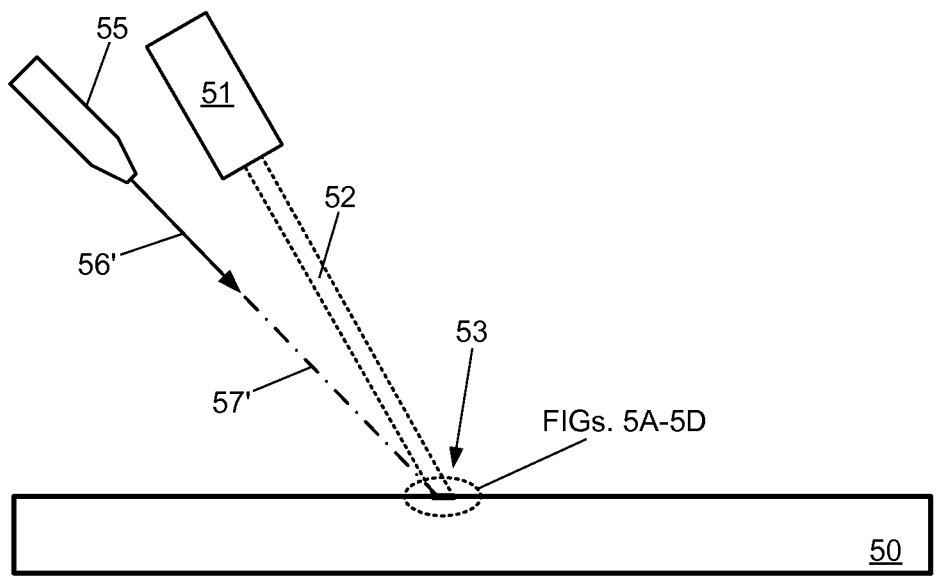

Referring now to FIG. 3, a flow chart 4 illustrating a method for cleaning a substrate is provided according to an embodiment. Furthermore, systems and methods for cleaning a substrate are illustrated in FIGS. 4A, 4B, and 5A through 5D.

As illustrated in FIGS. 3, 4A, 4B, and 5A-5D, the method illustrated in flow chart 4 begins in 41 with irradiating a region 62 on a substrate 50 containing one or more layers or structures 60A-D with infrared (IR) radiation and optionally ultraviolet (UV) radiation to remove material or undesired residues 65A-D from the one or more layers or structures 60A-D. As an example, the undesired residues may include surface adsorbates, particulates, moisture, etch residue, undesired carbon-containing residue, amorphous carbon-containing residue, hydrocarbon-containing residue, fluorocarbon-containing residue, halogen-containing residue, or polymer-containing residue, or any combination of two or more thereof.

The one or more layers or structures 60A-60D may include a low-k layer, an ultra low-k layer, a photo-resist layer, an anti-reflective coating (ARC) layer, an organic planarization layer (OPL), a soft mask layer, or a hard mask layer, or any combination of two or more thereof. Furthermore, the one or more layers or structures 60A-60D may include an un-patterned, blanket layer or structure, or the one or more layers or structures 60A-60D may include a patterned layer or structure, as shown in FIGS. 5A through 5D. For example, the patterned layer or structure may be formed using lithographic and/or etching processes. Additionally, for example, the patterned layer or structure may be formed using a patterned mask layer and an etching process.

The IR radiation may include a beam of IR radiation 52 emitted from an IR source 51 yielding a beam spot 53 on substrate 50. The IR source 51 may include one or more IR lamps, one or more IR LEDs (light emitting diodes), or one or more IR lasers, or a combination of two or more thereof. The IR radiation may be continuous or pulsed. The IR radiation may be broad band or narrow band. For example, the IR radiation may contain substantially monochromatic electromagnetic (EM) radiation having a narrow band of wavelengths. The IR radiation may include IR emission ranging in wavelength from approximately 1 micron to approximately 25 microns. Alternatively, the IR radiation may range in wavelength from approximately 2 microns to approximately 20 microns. Alternatively, the IR radiation may range in wavelength from approximately 8 microns to approximately 14 microns. Alternatively, the IR radiation may range in wavelength from approximately 8 microns to approximately 12 microns. Alternatively, the IR radiation may range in wavelength from approximately 9 microns to approximately 10 microns. A spectral content for the IR radiation may be selected to cause absorption in at least a portion of remnants of the one or more layers or structures 60A-60D, or at least a portion of the material or undesired residues to be removed.

The UV source (not shown) may include one or more UV lamps, one or more UV LEDs (light-emitting diodes), or one or more UV lasers, or a combination of two or more thereof. The UV radiation may be continuous or pulsed. The UV radiation may be broad band or narrow band. The UV radiation may include UV emission ranging in wavelength from approximately 100 nanometers (nm) to approximately 600 nm. Alternatively, the UV radiation may range in wavelength greater than approximately 250 nm.

The IR exposure and the UV exposure may be performed either sequentially or in parallel. For example, the irradiating may include IR irradiation simultaneous with UV radiation, preceded by UV radiation, or followed by UV irradiation, or any combination of two or more thereof.

During the IR exposure, or the UV exposure, or both, the one or more layers or structures 60A-D may be heated by elevating the substrate temperature of substrate 50 to a temperature ranging from approximately 20 degrees C. to approximately 250 degrees C. For example, the substrate temperature may be increased by elevating the temperature of a substrate holder in contact with substrate 50.

Additionally, thermal heating of substrate 50 may take place before IR exposure, during IR exposure, or after IR exposure, or any combination of two or more thereof. Additionally yet, thermal heating may take place before UV exposure, during UV exposure, or after UV exposure, or any combination of two or more thereof. Thermal heating may be performed by conductive heating, convective heating, or radiative heating, or any combination of two or more thereof.

In 42, at least a portion of region 62 is exposed to a gas or vapor jet (56, 56') emanating from a gas nozzle 55 along a jet axis (57, 57') in a direction towards substrate 50. For example, the jet axis (57, 57') may intersect with the beam spot 53 on substrate 50. The gas or vapor jet (56, 56') may be selected to be reactive or non-reactive with at least a portion of region 62. Further, the gas or vapor jet (56, 56') may contain He, Ne, Ar, Kr, Xe, $N_2$, $H_2$, $NH_3$, CO, $CO_2$, or $O_2$, or any combination of two or more thereof. For example, oxygen-containing gases may combine with carbon to produce volatile byproducts, such as CO or $CO_2$.

Figure 5A:
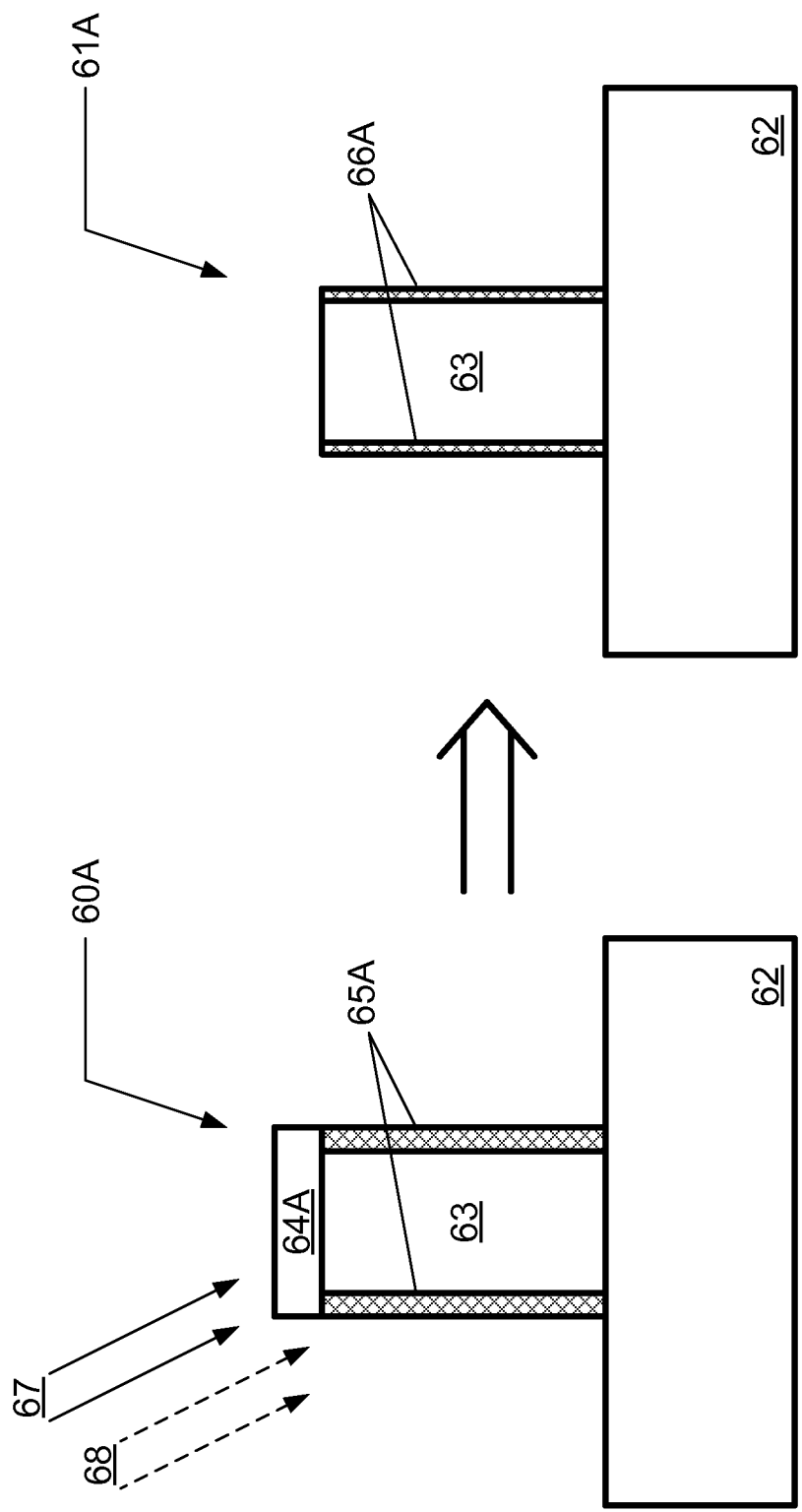
FIGS. 5A through 5D illustrate a method of cleaning a substrate according to yet additional embodiments.

In an example, a cleaning process is schematically illustrated in FIG. 5A. The cleaning process includes irradiating one or more layers or structures 60A containing a patterned low-k dielectric material 63 with IR radiation 67 assisted by UV radiation 68 to remove photo-resist layer 64A and photo-resist residue 65A on the sidewalls of patterned low-k dielectric material 63. As a result, the cleaning process produces one or more cleaned layers or structures 61A having reduced photo-resist 66A and/or photo-resist related damage. The inventors believe that UV radiation having UV emission greater than about 300 nm (although not limited to this wavelength range) may selectively graft polymer adsorbates at low substrate temperature, while absorption of IR radiation may assist the desorption of volatile polymer residue on exposed surfaces of the low-k dielectric material. As described above, the cleaning process may be further coupled with a reduced (e.g., less aggressive) ashing process.

Figure 5B:
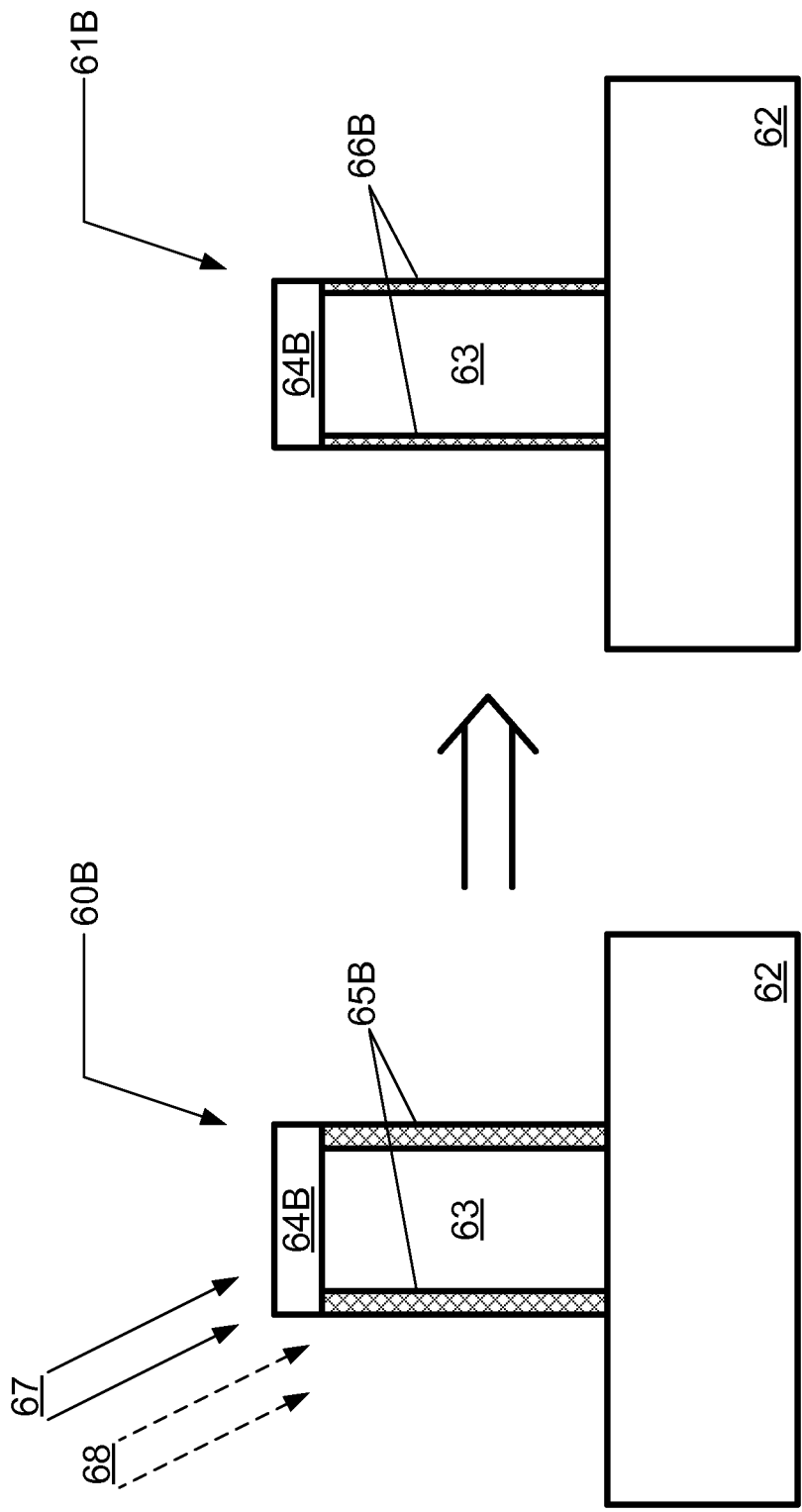

In another example, a cleaning process is schematically illustrated in FIG. 5B. The cleaning process includes irradiating one or more layers or structures 60B containing a patterned low-k dielectric material 63 and patterned hard mask/cap material 64B with IR radiation 67 assisted by UV radiation 68 to remove photo-resist residue 65B on the sidewalls of patterned low-k dielectric material 63. As a result, the cleaning process produces one or more cleaned layers or structures 61B having reduced photo-resist 66B and/or photo-resist related damage. The inventors believe that UV radiation having UV emission greater than about 300 nm (although not limited to this wavelength range) may selectively graft polymer adsorbates at low substrate temperature, while absorption of IR radiation may assist the desorption of volatile polymer residue on exposed surfaces of the low-k dielectric material. As described above, the cleaning process may be further coupled with a reduced (e.g., less aggressive) ashing process.

Figure 5C:
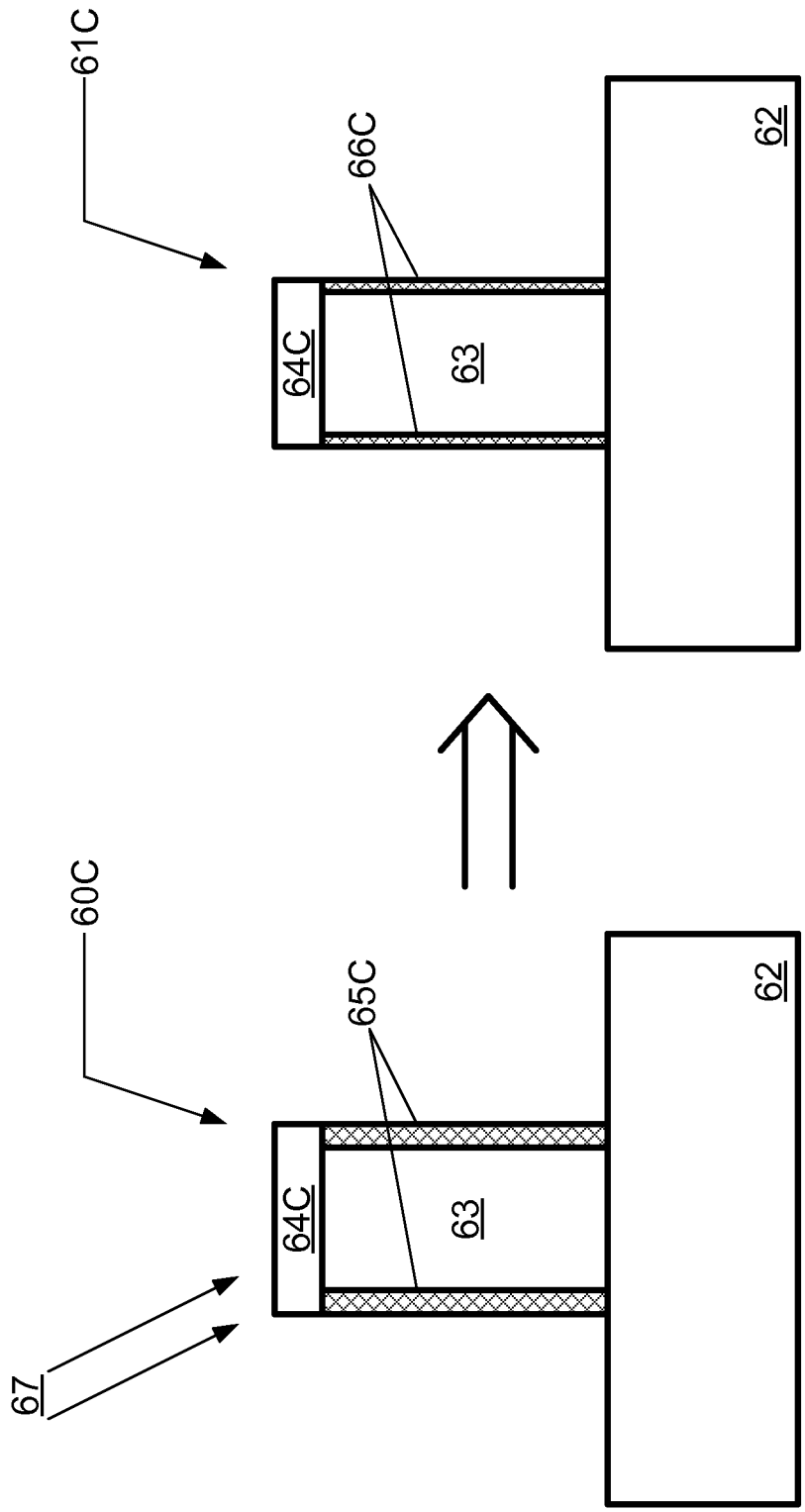

In another example, a cleaning process is schematically illustrated in FIG. 5C. The cleaning process includes irradiating one or more layers or structures 60C containing a patterned low-k dielectric material 63 and patterned hard mask/cap material 64C with IR radiation 67 to remove moisture 65C on the sidewalls of patterned low-k dielectric material 63. As a result, the cleaning process produces one or more cleaned layers or structures 61C having reduced moisture 66C and/or moisture related damage. The inventors believe that IR radiation may selectively heat the low-k dielectric material to remove moisture.

Figure 5D:
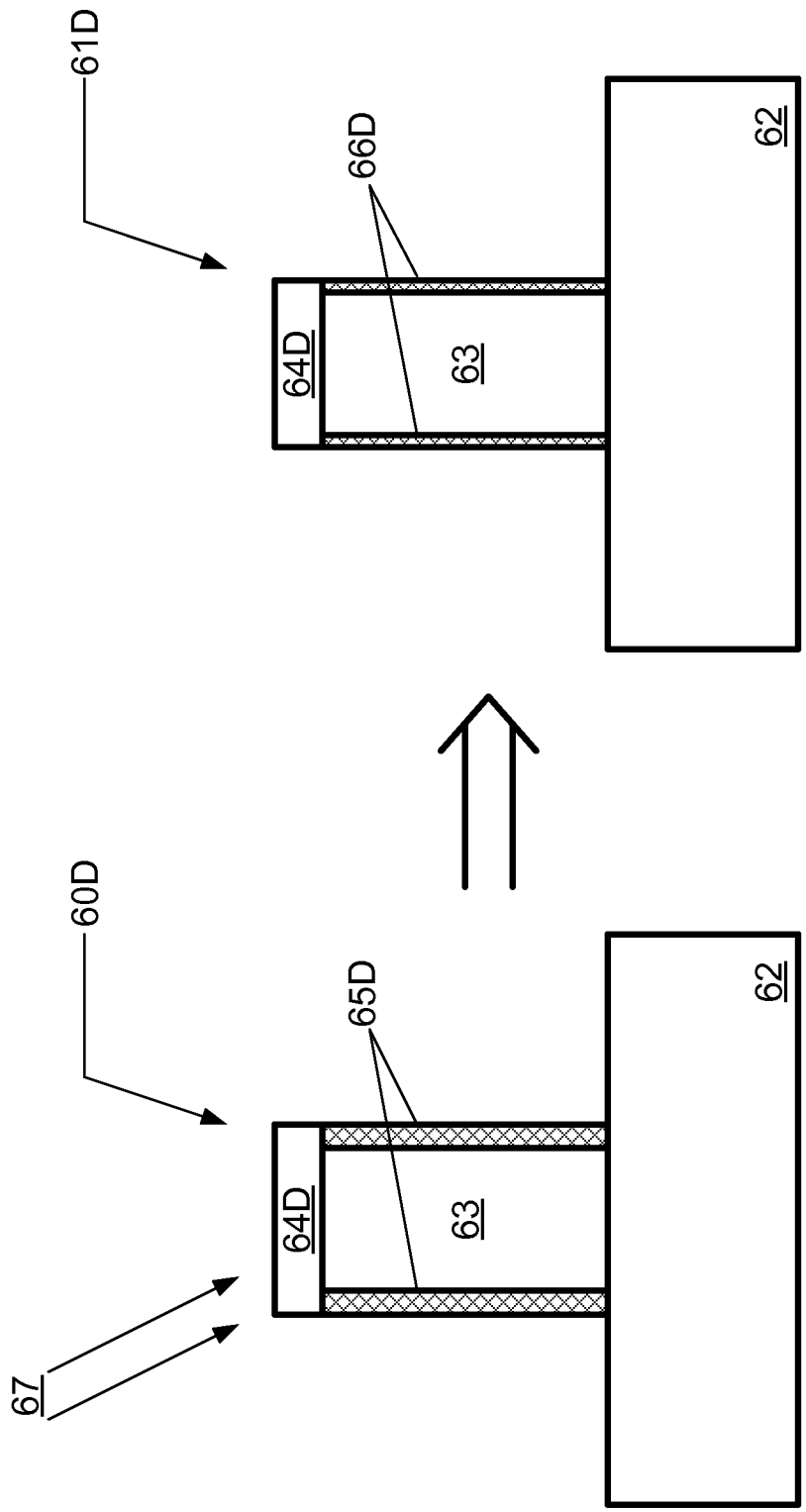

In another example, a cleaning process is schematically illustrated in FIG. 5D. The cleaning process includes irradiating one or more layers or structures 60D containing a patterned low-k dielectric material 63 and patterned soft mask/hard mask/cap material 64D with IR radiation 67 to remove amorphous carbon 65D on the sidewalls of patterned low-k dielectric material 63. As a result, the cleaning process produces one or more cleaned layers or structures 61D having reduced amorphous carbon 66D and/or amorphous carbon related damage. Additionally or alternatively, the cleaning process may include UV radiation. The inventors believe that IR and/or UV radiation may efficiently remove amorphous carbon to reduce dielectric constant k. Furthermore, the inventors believe that subsequent UV-induced silylation is more effectively applied following the IR and/or UV exposure in the cleaning process.

Figure 6:
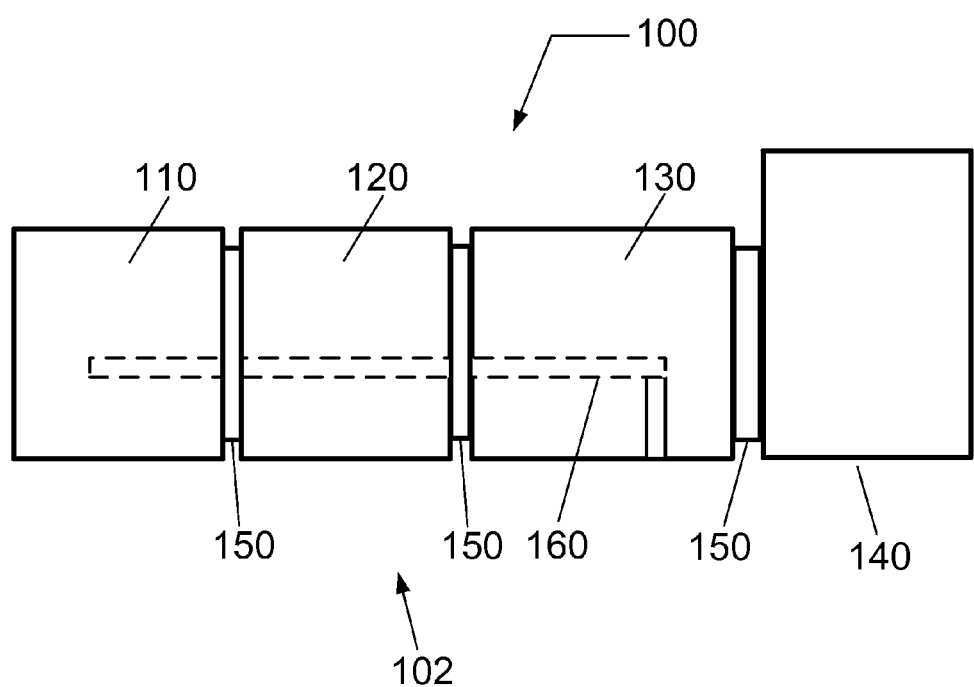
FIG. 6 illustrates a side view schematic representation of an exemplary transfer system for a treatment system according to an embodiment.
Figure 7:
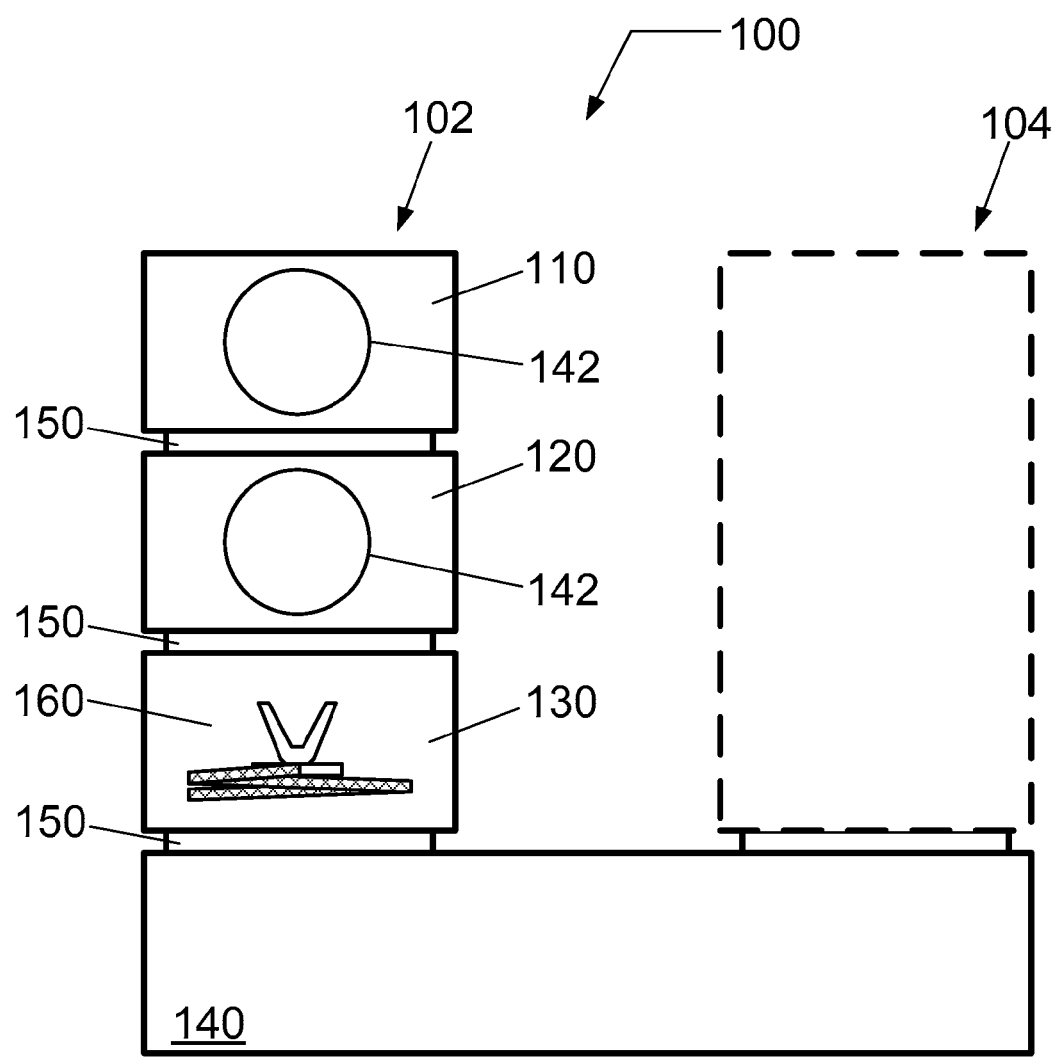
FIG. 7 illustrates a top view schematic representation of the transfer system depicted in FIG. 6.

According to one embodiment, FIGS. 6 and 7 provide a side view and top view, respectively, of a process platform 100 for treating a dielectric film on a substrate. The process platform 100 includes a first process module 110 and a second process module 120. The first process module 110 may include a curing system, a cleaning system, a surface modification system, or a drying system. The second process module 120 may include a curing system, a cleaning system, a surface modification system, or a drying system.

The drying system may be configured to remove, or reduce to sufficient levels, one or more contaminants, pore-generating materials, and/or cross-linking inhibitors in the dielectric film, including, for example, moisture, water, solvent, contaminants, pore-generating material, residual pore-generating material, a weakly bonded side group to the structure-forming material, pore-generating molecules, fragments of pore-generating molecules, cross-linking inhibitors, fragments of cross-linking inhibitors, or any other contaminant that may interfere with a curing process performed in the curing system.

For example, a sufficient reduction of a specific contaminant present within the dielectric film, from prior to the drying process to following the drying process, can include a reduction of approximately 10% to approximately 100% of the specific contaminant. The level of contaminant reduction may be measured using Fourier transform infrared (FTIR) spectroscopy, or mass spectroscopy. Alternatively, for example, a sufficient reduction of a specific contaminant present within the dielectric film can range from approximately 50% to approximately 100%. Alternatively, for example, a sufficient reduction of a specific contaminant present within the dielectric film can range from approximately 80% to approximately 100%.

Referring still to FIG. 6, the curing system may be configured to perform the preliminary curing process, or the final curing process, or both. Additionally, the curing system may be configured to cure the dielectric film by causing or partially causing cross-linking within the dielectric film in order to, for example, improve the mechanical properties of the dielectric film. Furthermore, the curing system may be configured to cure the dielectric film by causing or partially causing cross-link initiation, removal of pore-generating material, decomposition of pore-generating material, etc. The curing system can include one or more radiation sources configured to expose the substrate having the dielectric film to EM radiation at multiple EM wavelengths. For example, the one or more radiation sources can include an IR radiation source and a UV radiation source. The exposure of the substrate to UV radiation and IR radiation may be performed simultaneously, sequentially, or partially over-lapping one another. During sequential exposure, the exposure of the substrate to UV radiation can, for instance, precede the exposure of the substrate to IR radiation or follow the exposure of the substrate to IR radiation or both. Additionally, during sequential exposure, the exposure of the substrate to IR radiation can, for instance, precede the exposure of the substrate to UV radiation or follow the exposure of the substrate to UV radiation or both.

For example, the IR radiation can include an IR radiation source ranging from approximately 1 micron to approximately 25 microns. Additionally, for example, the IR radiation may range from about 2 microns to about 20 microns, or from about 8 microns to about 14 microns, or from about 8 microns to about 12 microns, or from about 9 microns to about 10 microns. Additionally, for example, the UV radiation can include a UV wave-band source producing radiation ranging from approximately 100 nanometers (nm) to approximately 600 nm. Furthermore, for example, the UV radiation may range from about 150 nm to about 400 nm, or from about 150 nm to about 300 nm, or from about 170 to about 240 nm, or from about 200 nm to about 240 nm.

Alternatively, the first process module 110 may comprise a first curing system configured to expose the substrate to UV radiation, and the second process module 120 may comprise a second curing system configured to expose the substrate to IR radiation.

IR exposure of the substrate can be performed in the first process module 110, or the second process module 120, or a separate process module (not shown).

Referring still to FIG. 6, the cleaning system may be configured to perform the removal of undesired residues. For example, the cleaning system may include any one of the systems described in FIGS. 4A and 4B.

Also, as illustrated in FIGS. 6 and 7, a transfer system 130 can be coupled to the second process module 120 in order to transfer substrates into and out of the first process module 110 and the second process module 120, and exchange substrates with a multi-element manufacturing system 140. Transfer system 130 may transfer substrates to and from the first process module 110 and the second process module 120 while maintaining a vacuum environment.

The first and second process modules 110, 120, and the transfer system 130 can, for example, include a processing element 102 within the multi-element manufacturing system 140. The transfer system 130 may comprise a dedicated substrate handler 160 for moving a one or more substrates between the first process module 110, the second process module 120, and the multi-element manufacturing system 140. For example, the dedicated substrate handler 160 is dedicated to transferring the one or more substrates between the process modules (first process module 110 and second process module 120), and the multi-element manufacturing system 140; however, the embodiment is not so limited.

For example, the multi-element manufacturing system 140 may permit the transfer of substrates to and from processing elements including such devices as etch systems, deposition systems, coating systems, patterning systems, metrology systems, etc. As an example, the deposition system may include one or more vapor deposition systems, each of which is configured to deposit a dielectric film on a substrate, wherein the dielectric film comprises a porous dielectric film, a non-porous dielectric film, a low dielectric constant (low-k) film, or an ultra low-k film. In order to isolate the processes occurring in the first and second systems, an isolation assembly 150 can be utilized to couple each system. For instance, the isolation assembly 150 can include at least one of a thermal insulation assembly to provide thermal insulation, and a gate valve assembly to provide vacuum isolation. The first and second process modules 110 and 120, and transfer system 130 can be placed in any sequence.

FIG. 7 presents a top-view of the process platform 100 illustrated in FIG. 6 for processing one or more substrates. In this embodiment, a substrate 142 is processed in the first and second process modules 110, 120. Although only one substrate is shown in each treatment system in FIG. 7, two or more substrates may be processed in parallel in each process module.

Referring still to FIG. 7, the process platform 100 may comprise a first process element 102 and a second process element 104 configured to extend from the multi-element manufacturing system 140 and work in parallel with one another. As illustrated in FIGS. 6 and 7, the first process element 102 may comprise first process module 110 and second process module 120, wherein a transfer system 130 utilizes the dedicated substrate handler 160 to move substrate 142 into and out of the first process element 102.

Figure 8:
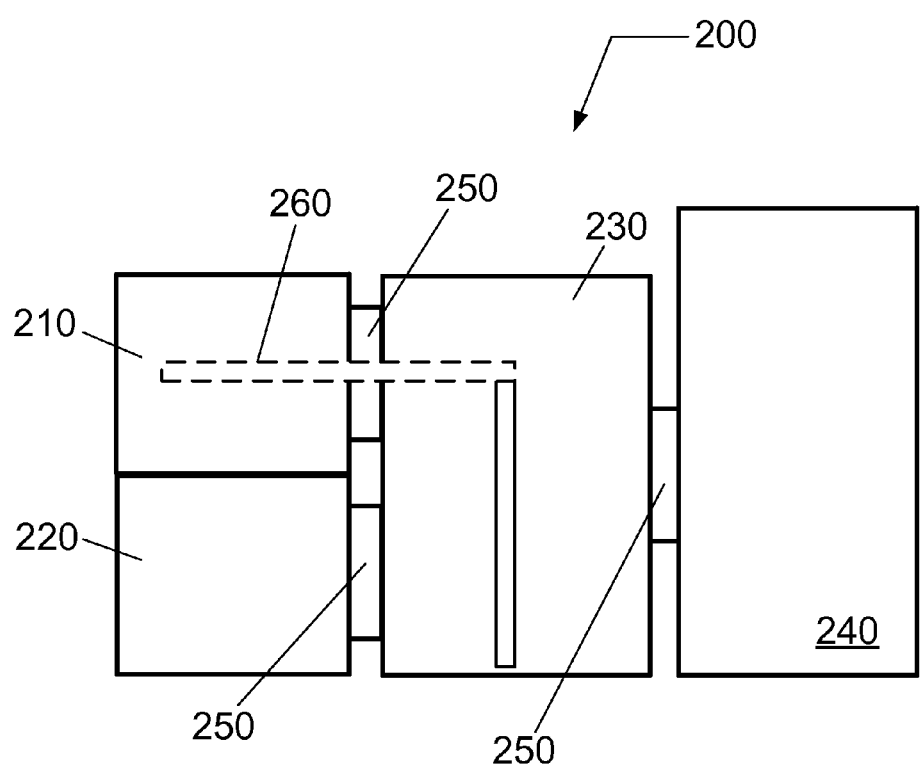
FIG. 8 illustrates a side view schematic representation of another exemplary transfer system for a treatment system according to another embodiment.

Alternatively, FIG. 8 presents a side-view of a process platform 200 for processing one or more substrates according to another embodiment. Process platform 200 may be configured for treating a dielectric film on a substrate.

The process platform 200 comprises a first process module 210, and a second process module 220, wherein the first process module 210 is stacked atop the second process module 220 in a vertical direction as shown. The first process module 210 may comprise a curing system, and the second process module 220 may comprise a drying system. Alternatively, the first process module 210 may comprise a first curing system configured to expose the substrate to UV radiation, and the second process module 220 may comprise a second curing system configured to expose the substrate to IR radiation.

Also, as illustrated in FIG. 8, a transfer system 230 may be coupled to the first process module 210, in order to transfer substrates into and out of the first process module 210, and coupled to the second process module 220, in order to transfer substrates into and out of the second process module 220. The transfer system 230 may comprise a dedicated handler 260 for moving one or more substrates between the first process module 210, the second process module 220 and the multi-element manufacturing system 240. The handler 260 may be dedicated to transferring the substrates between the process modules (first process module 210 and second process module 220) and the multi-element manufacturing system 240; however, the embodiment is not so limited.

Additionally, transfer system 230 may exchange substrates with one or more substrate cassettes (not shown). Although only two process modules are illustrated in FIG. 8, other process modules can access transfer system 230 or multi-element manufacturing system 240 including such devices as etch systems, deposition systems, coating systems, patterning systems, metrology systems, etc. As an example, the deposition system may include one or more vapor deposition systems, each of which is configured to deposit a dielectric film on a substrate, wherein the dielectric film comprises a porous dielectric film, a non-porous dielectric film, a low dielectric constant (low-k) film, or an ultra low-k film. An isolation assembly 250 can be used to couple each process module in order to isolate the processes occurring in the first and second process modules. For instance, the isolation assembly 250 may comprise at least one of a thermal insulation assembly to provide thermal insulation, and a gate valve assembly to provide vacuum isolation. Additionally, for example, the transfer system 230 can serve as part of the isolation assembly 250.

Figure 9:
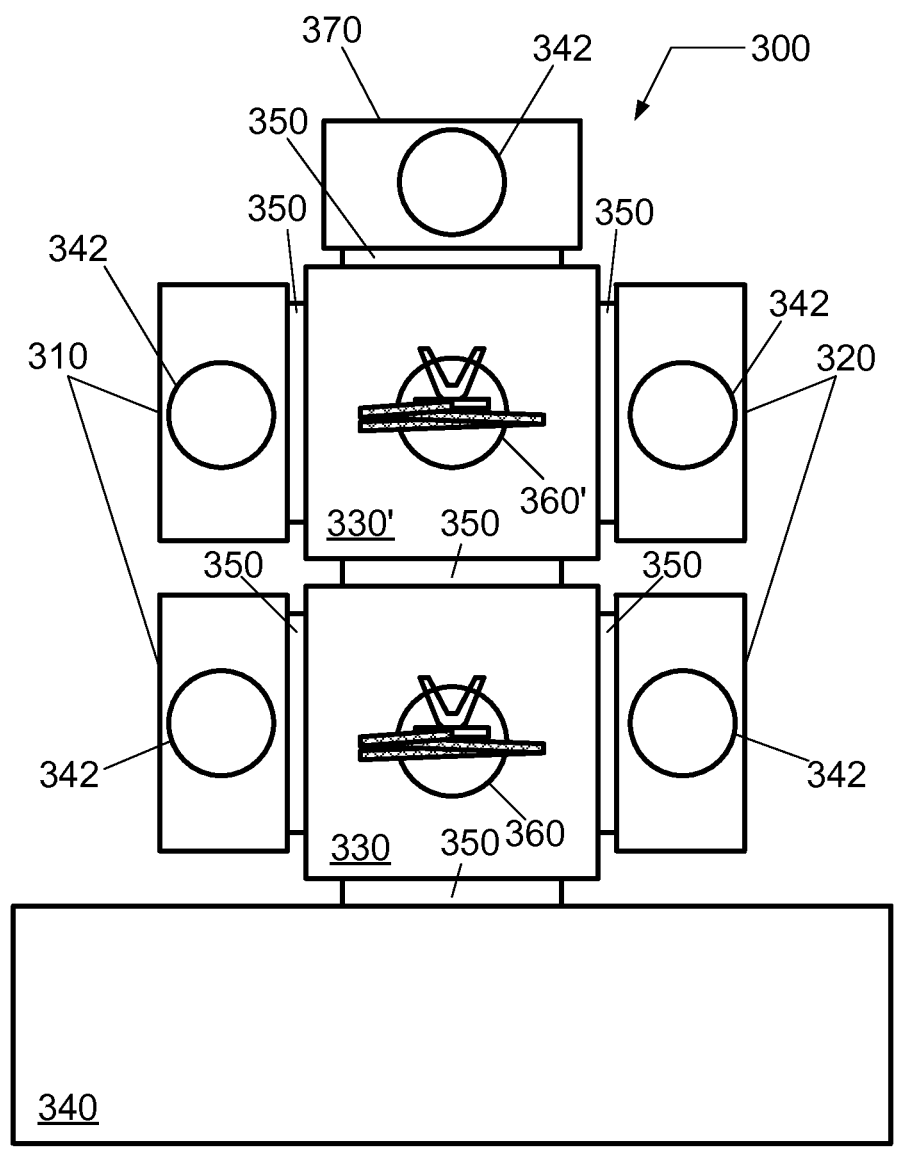
FIG. 9 illustrates a top view schematic representation of yet another exemplary transfer system for a treatment system according to another embodiment.

According to another embodiment, FIG. 9 presents a top view of a process platform 300 for processing a plurality of substrates 342. Process platform 300 may be configured for treating a dielectric film on a substrate. The process platform 300 comprises a first process module 310, a second process module 320, and an optional auxiliary process module 370 coupled to a first transfer system 330 and an optional second transfer system 330'. The first process module 310 may comprise a curing system, and the second process module 320 may comprise a drying system. Alternatively, the first process module 310 may comprise a first curing system configured to expose the substrate 342 to UV radiation, and the second process module 320 may comprise a second curing system configured to expose the substrate 342 to IR radiation.

Also, as illustrated in FIG. 9, the first transfer system 330 and the optional second transfer system 330' are coupled to the first process module 310 and the second process module 320, and configured to transfer one or more substrates 342 in and out of the first process module 310 and the second process module 320, and also to exchange one or more substrates 342 with a multi-element manufacturing system 340. The multi-element manufacturing system 340 may comprise a load-lock element to allow cassettes of substrates 342 to cycle between ambient conditions and low pressure conditions.

The first and second treatment systems 310, 320, and the first and optional second transfer systems 330, 330' can, for example, comprise a processing element within the multi-element manufacturing system 340. The transfer system 330 may comprise a first dedicated handler 360 and the optional second transfer system 330' comprises an optional second dedicated handler 360' for moving one or more substrates 342 between the first process module 310, the second process module 320, the optional auxiliary process module 370 and the multi-element manufacturing system 340.

In one embodiment, the multi-element manufacturing system 340 may permit the transfer of substrates 342 to and from processing elements including such devices as etch systems, deposition systems, coating systems, patterning systems, metrology systems, etc. Furthermore, the multi-element manufacturing system 340 may permit the transfer of substrates 342 to and from the auxiliary process module 370, wherein the auxiliary process module 370 may include an etch system, a deposition system, a coating system, a patterning system, a metrology system, etc. As an example, the deposition system may include one or more vapor deposition systems, each of which is configured to deposit a dielectric film on a substrate 342, wherein the dielectric film comprises a porous dielectric film, a non-porous dielectric film, a low dielectric constant (low-k) film, or an ultra low-k film.

In order to isolate the processes occurring in the first and second process modules, an isolation assembly 350 is utilized to couple each process module. For instance, the isolation assembly 350 may comprise at least one of a thermal insulation assembly to provide thermal isolation and a gate valve assembly to provide vacuum isolation. Of course, process modules 310 and 320, and transfer systems 330 and 330' may be placed in any sequence.

Figure 10:
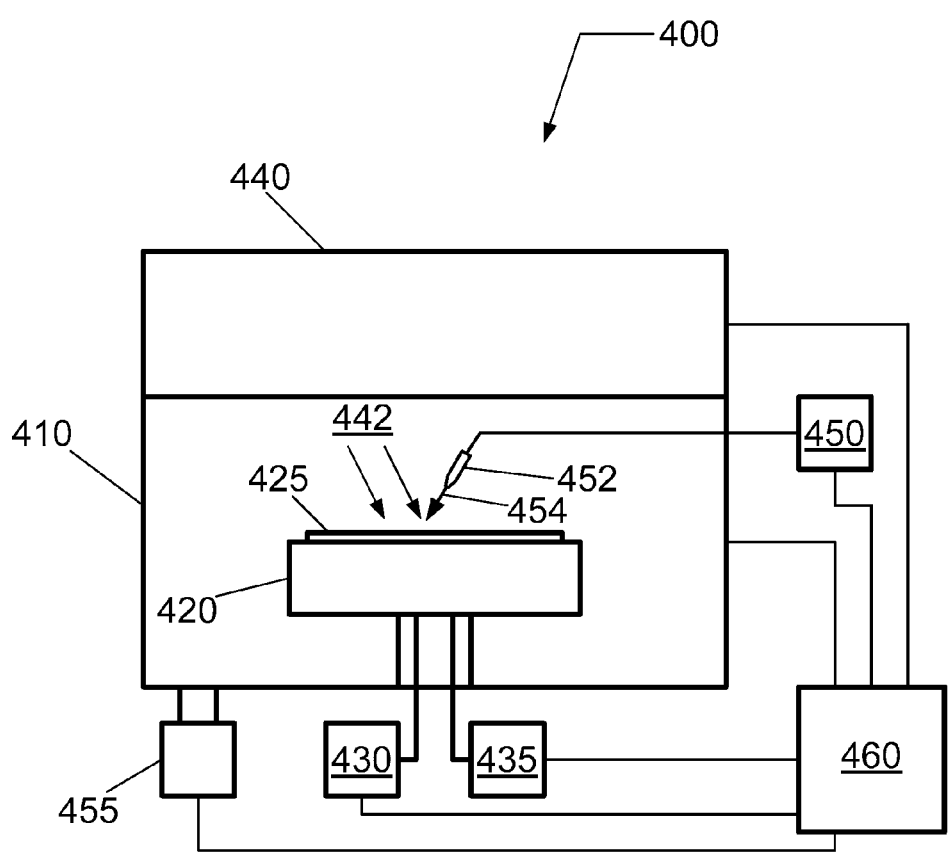
FIG. 10 is a schematic cross-sectional view of a process module according to another embodiment.

Referring now to FIG. 10, a process module 400 configured to treat a dielectric film on a substrate is shown according to another embodiment. As an example, the process module 400 may be configured to cure a dielectric film. As another example, the process module 400 may be configured to clean a dielectric film. As yet another example, the process module 400 may be configured to modify a surface on a dielectric film. Process module 400 includes a process chamber 410 configured to produce a clean, contaminant-free environment for curing, cleaning, and/or modifying a substrate 425 resting on substrate holder 420. Process module 400 further includes a radiation source 440 configured to expose substrate 425 having the dielectric film to EM radiation.

The EM radiation is dedicated to a specific radiation waveband, and includes single, multiple, narrow band, or broad band EM wavelengths within that specific radiation waveband. For example, the radiation source 440 can include an IR radiation source configured to produce EM radiation in the IR spectrum. Alternatively, for example, the radiation source 440 can include a UV radiation source configured to produce EM radiation in the UV spectrum. In this embodiment, IR treatment and UV treatment of substrate 425 can be performed in a separate process modules.

The IR radiation source may include a broad band IR source (e.g., polychromatic), or may include a narrow band IR source (e.g., monochromatic). The IR radiation source may include one or more IR lamps, one or more IR LEDs, or one or more IR lasers (continuous wave (CW), tunable, or pulsed), or any combination thereof. The IR power density may range up to about 20 W/cm$^2$. For example, the IR power density may range from about 1 W/cm$^2$ to about 20 W/cm$^2$.

Depending on the application, the IR radiation wavelength may range from approximately 1 micron to approximately 25 microns. Alternatively, the IR radiation wavelength may range from approximately 8 microns to approximately 14 microns. Alternatively, the IR radiation wavelength may range from approximately 8 microns to approximately 12 microns. Alternatively, the IR radiation wavelength may range from approximately 9 microns to approximately 10 microns. For example, the IR radiation source may include a $CO_2$ laser system. Additional, for example, the IR radiation source may include an IR element, such as a ceramic element or silicon carbide element, having a spectral output ranging from approximately 1 micron to approximately 25 microns, or the IR radiation source can include a semiconductor laser (diode), or ion, Ti:sapphire, or dye laser with optical parametric amplification.

The UV radiation source may include a broad band UV source (e.g., polychromatic), or may include a narrow band UV source (e.g., monochromatic). The UV radiation source may include one or more UV lamps, one or more UV LEDs, or one or more UV lasers (continuous wave (CW), tunable, or pulsed), or any combination thereof. UV radiation may be generated, for instance, from a microwave source, an arc discharge, a dielectric barrier discharge, or electron impact generation. The UV power density may range from approximately 0.1 mW/cm$^2$ to approximately 2000 mW/cm$^2$.

Depending on the application, the UV wavelength may range from approximately 100 nanometers (nm) to approximately 600 nm. Alternatively, the UV radiation may range from approximately 150 nm to approximately 400 nm. Alternatively, the UV radiation may range from approximately 150 nm to approximately 300 nm. Alternatively, the UV radiation may range from approximately 170 nm to approximately 240 nm. Alternatively, the UV radiation may range from approximately 200 nm to approximately 350 nm. Alternatively, the UV radiation may range from approximately 200 nm to approximately 240 nm. For example, the UV radiation source may include a direct current (DC) or pulsed lamp, such as a Deuterium ($D_2$) lamp, having a spectral output ranging from approximately 180 nm to approximately 500 nm, or the UV radiation source may include a semiconductor laser (diode), (nitrogen) gas laser, frequency-tripled (or quadrupled) Nd:YAG laser, or copper vapor laser.

The IR radiation source, or the UV radiation source, or both, may include any number of optical devices to adjust one or more properties of the output radiation. For example, each source may further include optical filters, optical lenses, beam expanders, beam collimators, etc. Such optical manipulation devices as known to those skilled in the art of optics and EM wave propagation are suitable for the invention.

The substrate holder 420 can further include a temperature control system that can be configured to elevate and/or control the temperature of substrate 425. The temperature control system can be a part of a thermal treatment device 430. The substrate holder 420 can include one or more conductive heating elements embedded in substrate holder 420 coupled to a power source and a temperature controller. For example, each heating element can include a resistive heating element coupled to a power source configured to supply electrical power. The substrate holder 420 could optionally include one or more radiative heating elements. Depending on the application, the temperature of substrate 425 can, for example, range from approximately 20 degrees C. to approximately 600 degrees C., and desirably, the temperature may range from approximately 100 degrees C. to approximately 600 degrees C. For example, the temperature of substrate 425 can range from approximately 300 degrees C. to approximately 500 degrees C., or from approximately 300 degrees C. to approximately 450 degrees C. Alternatively, for example, the temperature of substrate 425 can range from approximately 20 degrees C. to approximately 300 degrees C., or from approximately 20 degrees C. to approximately 250 degrees C.

The substrate holder 420 can further include a drive system 435 configured to translate, or rotate, or both translate and rotate the substrate holder 420 to move the substrate 425 relative to radiation source 440.

Additionally, the substrate holder 420 may or may not be configured to clamp substrate 425. For instance, substrate holder 420 may be configured to mechanically or electrically clamp substrate 425.

Although not shown, substrate holder 420 may be configured to support a plurality of substrates.

Referring again to FIG. 10, process module 400 can further include a gas injection system 450 coupled to the process chamber 410 and configured to introduce a purge gas or process gas that is either reactive or non-reactive with substrate 425 to process chamber 410. The gas injection system 450 may include a gas nozzle 452 configured to produce a gas or vapor jet 454 along a jet axis in a direction towards substrate 425. The gas or vapor jet 454 may be simultaneous with and/or intersecting with EM radiation 442 from radiation source 440. The purge gas or process gas may, for example, include an inert gas, such as a noble gas or nitrogen. Alternatively, the purge gas can include other gases listed above, such as for example $O_2$, $H_2$, $NH_3$, $C_xH_y$, or any combination thereof. Additionally, process module 400 can further include a vacuum pumping system 455 coupled to process chamber 410 and configured to evacuate the process chamber 410. During a curing process, substrate 425 can be subject to a purge gas environment with or without vacuum conditions.

Furthermore, as shown in FIG. 10, process module 400 can include a controller 460 coupled to process chamber 410, substrate holder 420, thermal treatment device 430, drive system 435, radiation source 440, gas injection system 450, and vacuum pumping system 455. Controller 460 includes a microprocessor, a memory, and a digital I/O port capable of generating control voltages sufficient to communicate and activate inputs to the process module 400 as well as monitor outputs from the process module 400. A program stored in the memory is utilized to interact with the process module 400 according to a stored process recipe. The controller 460 can be used to configure any number of processing elements (410, 420, 430, 435, 440, 450, or 455), and the controller 460 can collect, provide, process, store, and display data from processing elements. The controller 460 can include a number of applications for controlling one or more of the processing elements. For example, controller 460 can include a graphic user interface (GUI) component (not shown) that can provide easy to use interfaces that enable a user to monitor and/or control one or more processing elements.

Figure 11:
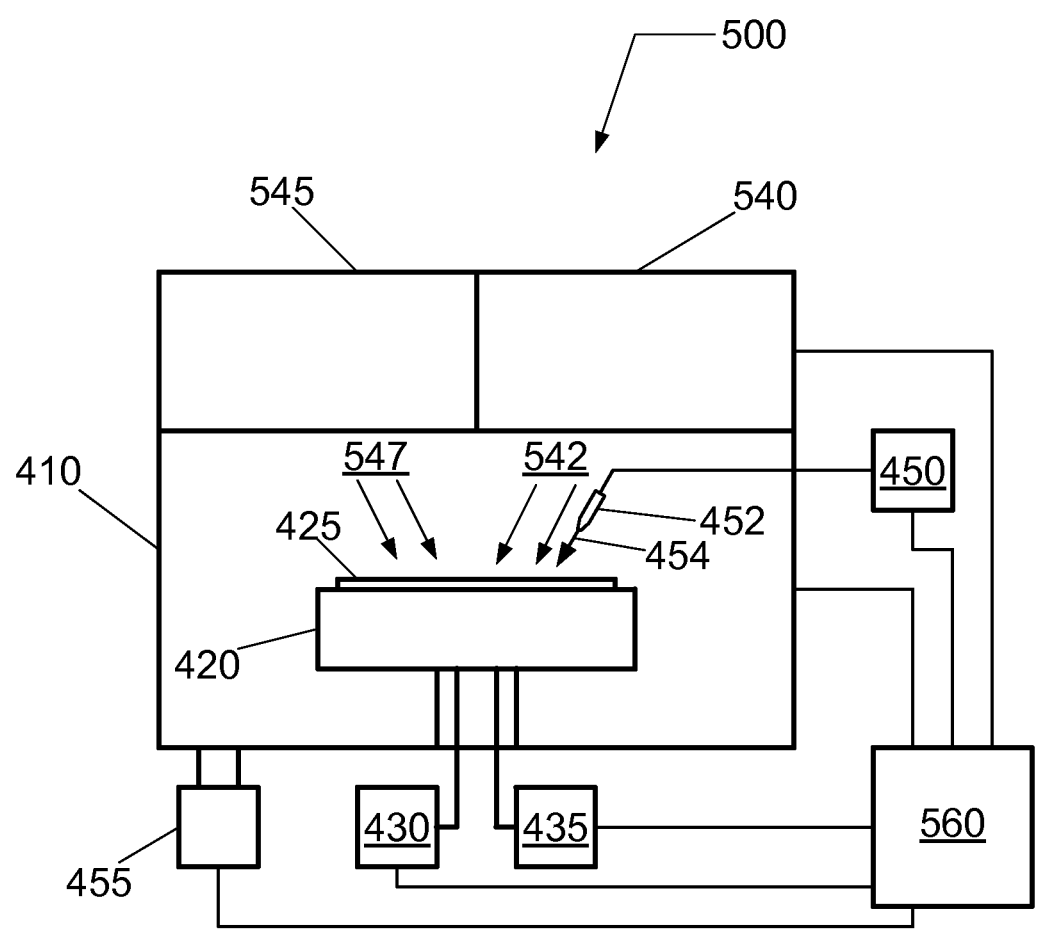
FIG. 11 is a schematic cross-sectional view of a process module according to another embodiment.

Referring now to FIG. 11, a process module 500 configured to treat a dielectric film on a substrate is shown according to another embodiment. As an example, the process module 500 may be configured to cure a dielectric film. As another example, the process module 400 may be configured to clean a dielectric film. As yet another example, the process module 400 may be configured to modify a surface on a dielectric film. Process module 500 includes many of the same elements as those depicted in FIG. 10. The process module 500 comprises process chamber 410 configured to produce a clean, contaminant-free environment for curing a substrate 425 resting on substrate holder 420. Process module 500 includes a first radiation source 540 configured to expose substrate 425 having the dielectric film to a first radiation source grouping of EM radiation.

Process module 500 further includes a second radiation source 545 configured to expose substrate 425 having the dielectric film to a second radiation source grouping of EM radiation. Each grouping of EM radiation is dedicated to a specific radiation wave-band, and includes single, multiple, narrow-band, or broadband EM wavelengths within that specific radiation wave-band. For example, the first radiation source 540 can include an IR radiation source configured to produce EM radiation in the IR spectrum. Additionally, for example, the second radiation source 545 can include a UV radiation source configured to produce EM radiation in the UV spectrum. In this embodiment, IR treatment and UV treatment of substrate 425 can be performed in a single process module.

Additionally, the gas or vapor jet 454 may be simultaneous with and/or intersecting with first EM radiation 542 from first radiation source 540 and/or second EM radiation 547 from second radiation source 545.

Furthermore, as shown in FIG. 11, process module 500 can include a controller 560 coupled to process chamber 410, substrate holder 420, thermal treatment device 430, drive system 435, first radiation source 540, second radiation source 545, gas injection system 450, and vacuum pumping system 455. Controller 560 includes a microprocessor, a memory, and a digital I/O port capable of generating control voltages sufficient to communicate and activate inputs to the process module 500 as well as monitor outputs from the process module 500. A program stored in the memory is utilized to interact with the process module 500 according to a stored process recipe. The controller 560 can be used to configure any number of processing elements (410, 420, 430, 435, 540, 545, 450, or 455), and the controller 560 can collect, provide, process, store, and display data from processing elements. The controller 460 can include a number of applications for controlling one or more of the processing elements. For example, controller 560 can include a graphic user interface (GUI) component (not shown) that can provide easy to use interfaces that enable a user to monitor and/or control one or more processing elements.

Various assemblies of EM radiation sources and optical systems thereof may be found in pending U.S. patent application Ser. No. 12/211,598, entitled "DIELECTRIC TREATMENT SYSTEM AND METHOD OF OPERATING", filed on Sep. 16, 2008, and published as U.S. Patent Application Publication No. 2010/0065758; the entire content of which is herein incorporated by reference.

Figure 12:
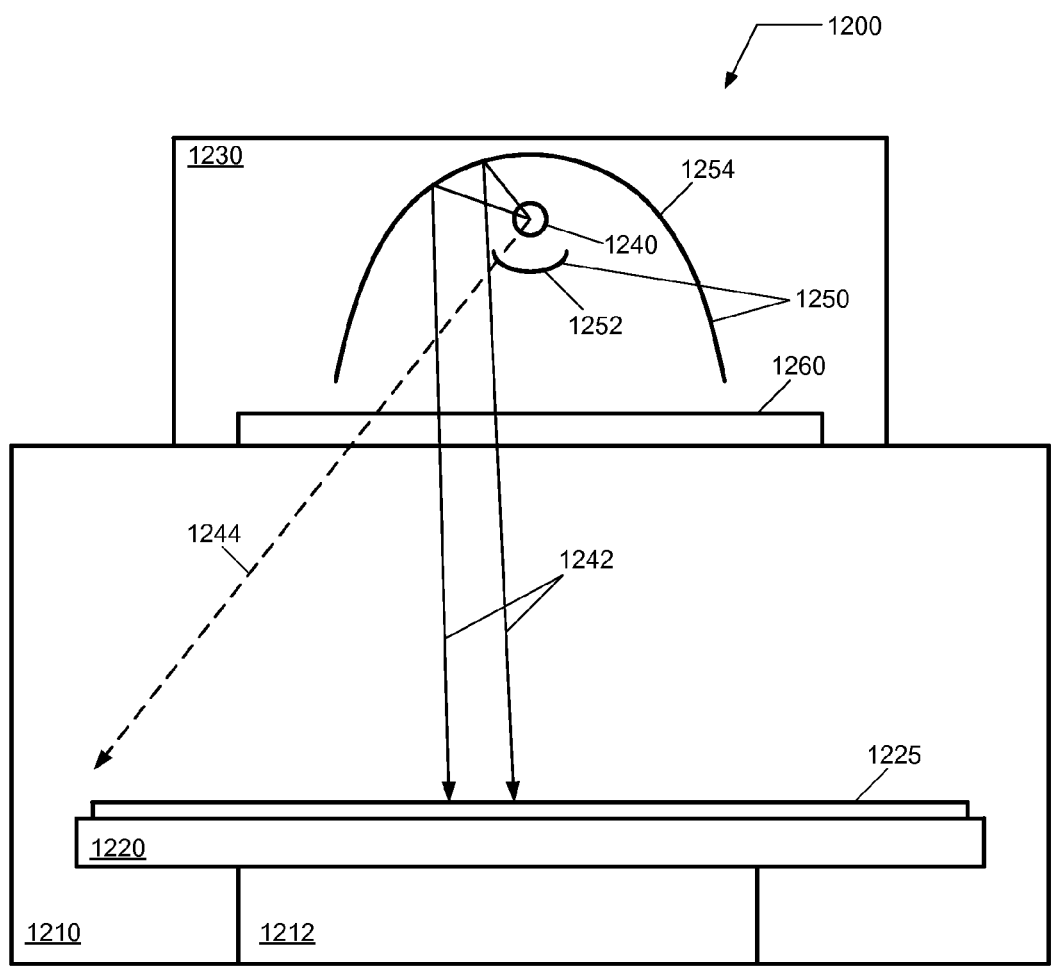
FIG. 12 is a schematic cross-sectional view of a process module according to another embodiment.

Referring now to FIG. 12, a schematic illustration of a process module 1200 is presented according to an embodiment. The process module 1200 includes a process chamber 1210 configured to produce a clean, contaminant-free environment for curing, cleaning, and/or modifying a substrate 1225 resting on substrate holder 1220. Process module 1200 further includes a radiation source 1230 configured to expose substrate 1225 to EM radiation.

The radiation source 1230 includes a UV lamp 1240, and a reflector 1250 for directing UV radiation 1242 from the UV lamp 1240 to substrate 1225. Alternatively, the radiation source 1230 may include an IR lamp. The reflector 1250 has a dichroic reflector 1254, and a non-absorbing reflector 1252 disposed between the UV lamp 1240 and substrate 1225. The non-absorbing reflector 1252 is configured to reflect UV radiation 1242 from the UV lamp 1240 towards the dichroic reflector 1254, wherein the non-absorbing reflector 1252 substantially prevents direct UV radiation 1244 from the UV lamp 1240 to substrate 1225. The dichroic reflector 1254 may be utilized to select at least a portion of the UV radiation spectrum emitted by the UV lamp 1240. For example, radiation source 1230 may be configured to irradiate substrate 1225 with UV radiation containing emission ranging from about 250 nm to about 450 nm, or about 200 nm to about 300 nm, or about 200 nm to about 290 nm, depending on the type of dichroic coating. The dichroic coating may include one or more dielectric layers.

Filtering by reflection on a dichroic coating usually does not affect the original forward rays emitted directly from the UV lamp. Consequently, a typical UV lamp using dichroic reflector still emits a significant amount of emission outside of the desired wavelength range, causing overheating of the substrate and inefficient porogen removal. The inventors propose to use a second reflection on reflectors with dichroic coating in order to obtain the desired emission spectrum.

In one embodiment, the non-absorbing reflector 1252 is separate from the UV lamp 1240, as shown in FIG. 11. In another embodiment, the non-absorbing reflector 1252 includes a coating applied to an underside of the UV lamp 1240.

The non-absorbing reflector 1252 may include a concave reflecting surface oriented to face a concave reflecting surface of the dichroic reflector 1254, and the non-absorbing reflector 1252 may be positioned between the dichroic reflector 1254 and the substrate 1225. Additionally, an apex and a focus of the concave reflecting surface of the non-absorbing reflector 1252, and an apex and a focus of the concave reflecting surface of the dichroic reflector 1254 may be collinear. Furthermore, the non-absorbing reflector 1252 and/or the dichroic reflector 1254 may include a cylindrical or spherical geometry having a circular, an elliptical, a parabolic, or a hyperbolic cross-section. The shape, orientation, and/or position of the non-absorbing reflector 1252 and/or the dichroic reflector 1254 may be adjusted to provide optimal irradiation of substrate 1225.

The process module 1200 may include a UV window 1260 disposed between the reflector 1250 and the substrate 1225.

The process module 1200 may further include an IR source, such as an IR source that provides substantially monochromatic EM radiation having a narrow band of wavelengths, or an IR laser. Additionally, the process module 1200 may further include a temperature control system coupled to the substrate holder 1220 and configured to control a temperature of the substrate 1225. Additionally, the process module 1200 may further include a drive system 1212 coupled to the substrate holder 1220, and configured to translate, or rotate, or both translate and rotate the substrate holder 1220.

Additionally yet, the process module 1200 may further include a gas supply system coupled to the process chamber 1210, and configured to introduce a purge gas and/or process gas to the process chamber 1210. For example, the gas supply system may include a nozzle configured to produce a gas or vapor jet emanating from the nozzle along a jet axis in a direction towards substrate 1225.

Figure 13:
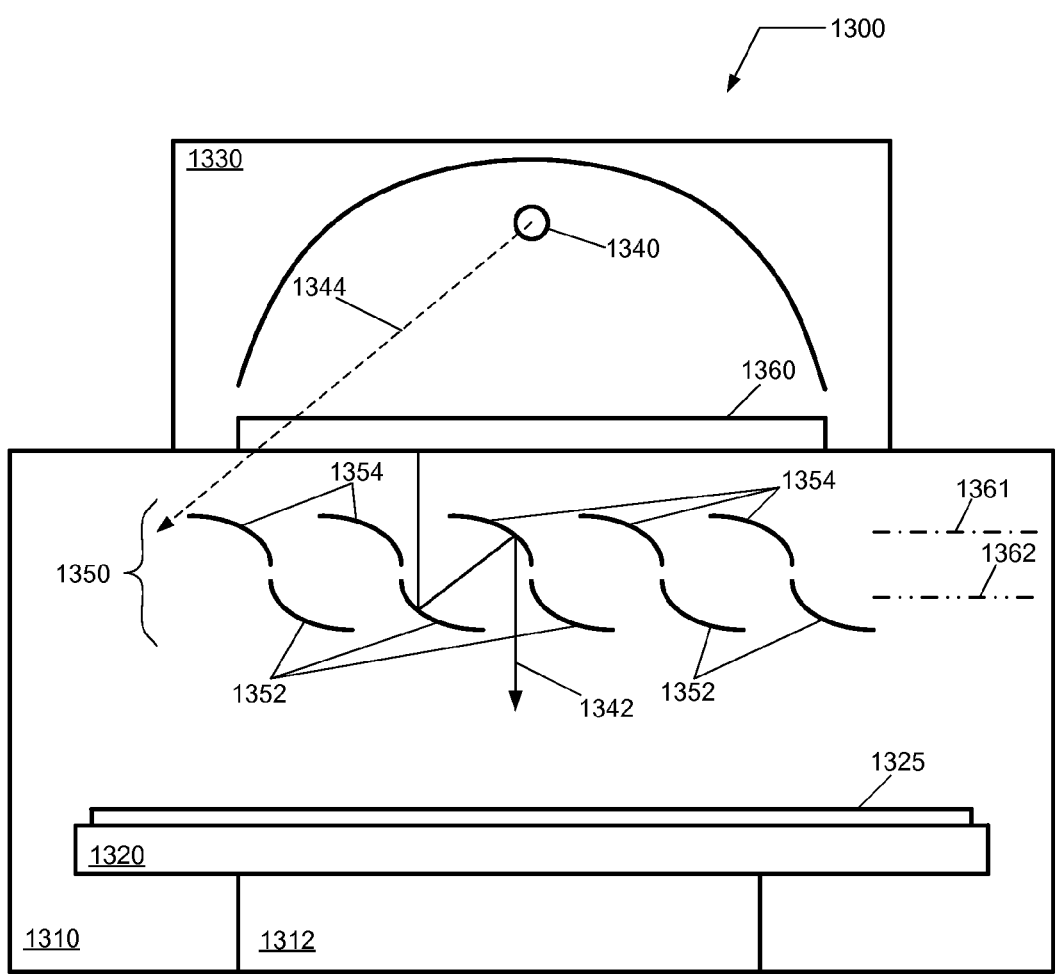
FIG. 13 is a schematic cross-sectional view of a process module according to another embodiment.

Referring now to FIG. 13, a schematic illustration of a process module 1300 is presented according to an embodiment. The process module 1300 includes a process chamber 1310 configured to produce a clean, contaminant-free environment for curing, cleaning, and/or modifying a substrate 1325 resting on substrate holder 1320. Process module 1300 further includes a radiation source 1330 configured to expose substrate 1325 to EM radiation.

The radiation source 1330 includes a UV lamp 1340, and a reflector 1350 for directing UV radiation 1342 from the UV lamp 1340 to substrate 1325. Alternatively, the radiation source 1330 may include an IR lamp. The reflector 1350 has a dichroic reflector 1354, and a non-absorbing reflector 1352 disposed between the UV lamp 1340 and substrate 1325. The non-absorbing reflector 1352 is configured to reflect UV radiation 1342 from the UV lamp 1340 towards the dichroic reflector 1354, wherein the non-absorbing reflector 1352 substantially prevents direct UV radiation 1244 from the UV lamp 1340 to substrate 1325. The dichroic reflector 1354 may be utilized to select at least a portion of the UV radiation spectrum emitted by the UV lamp 1340. For example, radiation source 1330 may be configured to irradiate substrate 1325 with UV radiation containing emission ranging from about 250 nm to about 450 nm, or about 200 nm to about 300 nm, or about 200 nm to about 290 nm, depending on the type of dichroic coating. The dichroic coating may include one or more dielectric layers.

As shown in FIG. 12, the dichroic reflector 1354 comprises a plurality of dichroic reflecting elements arranged in a first plane 1361 parallel with substrate 1325 and located above substrate 1325, and the non-absorbing reflector 1252 comprises a plurality of non-absorbing reflecting elements arranged in a second plane 1362 parallel with substrate 1325 and located above substrate 1325 and below the first plane 1361. Further, the plurality of non-absorbing reflecting elements and the plurality of dichroic reflecting elements are arranged as pairs such that a one-to-one relationship exists between each of the plurality of non-absorbing reflecting elements and each of the plurality of dichroic reflecting elements.

The non-absorbing reflector 1352 may include a concave reflecting surface oriented to face a concave reflecting surface of the dichroic reflector 1354, and the non-absorbing reflector 1352 may be positioned between the dichroic reflector 1354 and the substrate 1325. The process module 1300 may include a UV window 1360 disposed between the reflector 1350 and the UV lamp 1340.

The shape, orientation, and/or position of the non-absorbing reflector 1352 and/or the dichroic reflector 1354 may be adjusted to provide optimal irradiation of substrate 1325.

The process module 1300 may further include an IR source, such as an IR source that provides substantially monochromatic EM radiation having a narrow band of wavelengths, or an IR laser. Additionally, the process module 1300 may further include a temperature control system coupled to the substrate holder 1320 and configured to control a temperature of the substrate 1325. Additionally, the process module 1300 may further include a drive system 1312 coupled to the substrate holder 1320, and configured to translate, or rotate, or both translate and rotate the substrate holder 1320.

Additionally yet, the process module 1300 may further include a gas supply system coupled to the process chamber 1310, and configured to introduce a purge gas and/or process gas to the process chamber 1310. For example, the gas supply system may include a nozzle configured to produce a gas or vapor jet emanating from the nozzle along a jet axis in a direction towards substrate 1325.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method of integrating a dielectric film on a substrate, comprising:
   preparing a dielectric film on a substrate, said dielectric film being a low-k dielectric film having a dielectric constant less than or equal to a value of about 4;
   performing a preliminary curing process on said dielectric film;
   forming a pattern in said dielectric film using a lithographic process and an etching process;
   removing undesired residues, occurring as a result of the forming said pattern, from a side wall surface of the pattern in said dielectric film by directly irradiating said undesired residues on the side wall surface of the pattern at least with infrared (IR) radiation; and
   after said removing step, performing a final curing process on said dielectric film, said final curing process includes irradiating said substrate with at least one of said infrared (IR) radiation and ultraviolet (UV) radiation.

2. The method of claim 1, wherein said preliminary curing process is performed at a first substrate temperature, and said final curing process is performed at a second substrate temperature greater than said first substrate temperature.

3. The method of claim 1, wherein said performing said preliminary curing process comprises performing in any order one or more of the following:
   irradiating said substrate with said ultraviolet (UV) radiation;
   irradiating said substrate with said infrared (IR) radiation; and
   heating said substrate by elevating a temperature of a substrate holder in contact with said substrate.

4. The method of claim 3, wherein said ultraviolet (UV) radiation comprises an emission of light ranging between about 200 nm (nanometers) and about 350 nm.

5. The method of claim 3, wherein said infrared (IR) radiation comprises an emission of light ranging between about 8 microns and about 12 microns.

6. The method of claim 1, wherein said performing said final curing process comprises performing in any order one or more of the following:
   irradiating said substrate with said ultraviolet (UV) radiation;
   irradiating said substrate with said infrared (IR) radiation; and
   heating said substrate by elevating the temperature of a substrate holder in contact with said substrate.

7. The method of claim 6, wherein said ultraviolet (UV) radiation comprises an emission of light ranging between about 200 nm (nanometers) and about 350 nm.

8. The method of claim 6, wherein said infrared (IR) radiation comprises an emission of light ranging between about 8 microns and about 12 microns.

9. The method of claim 6, further comprising:
   maintaining a substrate temperature between about 300 degrees C. and about 450 degrees C. during said final curing process.

10. The method of claim 1, wherein said removing undesired residues further comprises performing an ashing process, or a wet cleaning process, or both.

11. The method of claim 1, wherein said removing undesired residues further comprises irradiating said substrate containing said pattern in said dielectric film with said ultraviolet (UV) radiation.

12. The method of claim 11, wherein said removing undesired residues further comprises exposing said substrate to a gas or vapor jet emanating from a nozzle along a jet axis in a direction towards said substrate.

13. The method of claim 12, wherein said infrared (IR) radiation comprises a beam of said infrared (IR) radiation yielding a beam spot on said substrate intersecting with said jet axis.

14. The method of claim 1, wherein said removing undesired residues further comprises maintaining a substrate temperature at a temperature between about 20 degrees C. and about 250 degrees C.

15. The method of claim 1, wherein said undesired residues includes surface adsorbates, particulates, moisture, etch residue, undesired carbon-containing residue, amorphous carbon-containing residue, hydrocarbon-containing residue, fluorocarbon-containing residue, halogen-containing residue, or polymer-containing residue, or any combination of two or more thereof.

16. The method of claim 1, further comprising:
   performing a silylation process following said removing undesired residues, and preceding said performing said final curing process.

17. The method of claim 16, wherein said silylation process further comprises irradiating said substrate with said ultraviolet (UV) radiation.

18. The method of claim 16, wherein said silylation process comprises introducing a silane compound, a silazane compound, HMDS, or TMCS, or any combination of two or more thereof.

19. The method of claim 16, wherein said silylation process comprises maintaining a substrate temperature between about 200 degrees C. and about 400 degrees C.

20. The method of claim 1, further comprising:
   dehydrating said dielectric film following said removing undesired residues, and preceding said performing said final curing process.

21. The method of claim 1, wherein the removing undesired residues comprises removing material containing a substantial amount of carbon.

* * * * *